United States Patent
Kim et al.

[11] Patent Number: 5,877,653
[45] Date of Patent: Mar. 2, 1999

[54] LINEAR POWER AMPLIFIER AND METHOD FOR REMOVING INTERMODULATION DISTORTION WITH PREDISTORTION SYSTEM AND FEED FORWARD SYSTEM

[75] Inventors: Young Kim, Seoul; Jong-Tae Park; Hong-Kee Kim, both of Seongnam; Young-Kon Lee; Seung-Won Chung, both of Seoul; Seong-Hoon Lee, Seongnam; Soon-Chul Jeong, Ahnyang; Chul-Dong Kim; Ik-Soo Chang, both of Seoul, all of Rep. of Korea

[73] Assignee: SamSung Electronics Co., Ltd., Suwon, Rep. of Korea

[21] Appl. No.: 751,703

[22] Filed: Nov. 18, 1996

[30]      Foreign Application Priority Data

Nov. 16, 1995  [KR]  Rep. of Korea ................. 1995-41669
Nov. 4, 1996   [KR]  Rep. of Korea ................. 1996-51910

[51] Int. Cl.⁶ ........................................................ H03F 1/26
[52] U.S. Cl. ........................................... 330/149; 330/151
[58] Field of Search ................................. 330/107, 129, 330/136, 149, 151

[56]                References Cited

U.S. PATENT DOCUMENTS

| | | | |
|---|---|---|---|
| 3,922,617 | 11/1975 | Denniston et al. | 330/149 |
| 4,329,655 | 5/1982 | Nojima et al. | 330/149 |
| 4,701,717 | 10/1987 | Radermacher et al. | 330/149 |
| 4,885,551 | 12/1989 | Myer | 330/52 |
| 4,943,783 | 7/1990 | Nojima | 330/149 |
| 4,967,164 | 10/1990 | Sari | 330/149 |
| 5,077,532 | 12/1991 | Obermann et al. | 330/151 |
| 5,119,040 | 6/1992 | Long et al. | 330/149 |
| 5,130,663 | 7/1992 | Tattersall, Jr. | 330/52 |
| 5,148,117 | 9/1992 | Talwar | 330/151 |
| 5,155,448 | 10/1992 | Powell | 330/149 |
| 5,166,634 | 11/1992 | Narahashi et al. | 330/151 |
| 5,237,288 | 8/1993 | Cleveland | 330/107 |
| 5,304,945 | 4/1994 | Myer | 330/149 |
| 5,307,022 | 4/1994 | Tattersall, Jr. et al. | 330/52 |
| 5,327,096 | 7/1994 | Sakamoto et al. | 330/151 |
| 5,455,537 | 10/1995 | Larkin et al. | 330/52 |
| 5,491,454 | 2/1996 | Matz | 330/149 |
| 5,523,716 | 6/1996 | Grebliunas et al. | 330/149 |
| 5,524,286 | 6/1996 | Chiesa et al. | 455/126 |
| 5,570,063 | 10/1996 | Eisenberg | 330/149 |

FOREIGN PATENT DOCUMENTS

0411180 A1   2/1991   European Pat. Off. .
WO 91/07813  5/1991   WIPO .

*Primary Examiner*—Steven Mottola
*Attorney, Agent, or Firm*—Robert E. Bushnell, Esq.

[57]                ABSTRACT

A linear power amplifier and method for removing the intermodulation distortion with a predistortion system and a feed forward system. The linear power amplifier having a main power amplifier includes: a predistortion system for firstly suppressing the intermodulation signal generated upon amplification of an RF signal in the main power amplifier, by generating a harmonics corresponding to the input RF signal and a predistortion signal with coupling the RF signal to the harmonics; and a feed forward system for secondly suppressing the intermodulation signal by canceling the input RF signal and the output of the main power amplifier, extracting an intermodulation signal distortion, error-amplifying the extracted intermodulation signal distortion, and coupling the amplified intermodulation signal with the output of the main power amplifier.

37 Claims, 19 Drawing Sheets

LINEAR POWER AMPLIFIER AND METHOD FOR REMOVING INTERMODULATION DISTORTION WITH PREDISTORTION SYSTEM AND FEED FORWARD SYSTEM

CLAIM FOR PRIORITY

This application makes reference to, incorporates the same herein, and claims all benefits accruing under 35 U.S.C. §119 from applications for LINEAR POWER AMPLIFYING DEVICE AND METHOD earlier filed in the Korean Industrial Property Office on 16 Nov. 1995 and on 4 Nov. 1996, respectively, and there duly assigned Ser. No. 41669/1995.

BACKGROUND OF THE INVENTION

1. Technical Field

The present invention relates to a linear power amplifier, and more particularly, to a linear power amplifier and method able to minimize intermodulation distortion with a predistortion technique and feed forward technique.

2. Background Art

High power amplifiers (HPA) are used in a wide variety of communications and other electronic applications. High power amplifiers typically operate in the vicinity of a saturation region having non-linear characteristics in order to generate a maximum output. However, we have noticed that if more than one carrier, i.e., a multi-carrier is applied to the high power amplifier, its non-linear characteristics introduce unwanted multiplicative interaction of the signals being amplified and the amplifier output contains intermodulation distortion (IMD). Intermodulation distortion is highly undesirable because it causes interference, crosstalk, and other deleterious effects on the performance of a system employing the high power amplifier. Generally, intermodulation distortion can be reduced by either negative feedback of the distortion components, predistortion of the signal to be amplified to cancel the amplifier generated distortion, or by separating the distortion components of the amplifier output and feeding forward the distortion components to cancel the distortion in the amplifier output signal.

Conventional negative feedback techniques for reducing intermodulation distortion produced by high power amplifiers such as disclosed in U.S. Pat. No. 4,929,906 for Amplifier Linearization Using Down/Up Conversion issued to Voyce, and U.S. Pat. No. 5,237,288 for RF Power Amplifier Linearization issued to Cleveland, generally seek to feed the power amplifier's output back to a differencing or error stage for intermodulation distortion reduction. We have found that such feedback systems are intended for low frequency applications and do not take into account RF design considerations such as time delay and drift. Nevertheless, feedback system are preferable for RF power amplifiers because they are closed loop systems that are less susceptible to changes caused by aging and environmental factors.

Efforts to implement predistortion techniques for reducing intermodulation distortion such as those disclosed in U.S. Pat. No. 4,967,164 for Adaptive Predistortion Circuit issued to Sari, U.S. Pat. No. 5,523,716 for Microwave Predistortion Linearizer issued to Grebliunas et al., and U.S. Pat. No. 5,524,286 for Baseband Predistortion System For The Adaptive Linearization Of Power Amplifiers issued to Chiesa et al., generally utilize an auxiliary distortion source that produces an auxiliary distortion signal similar to the distortion generated by the power amplifier. The auxiliary distortion signal is added to the power amplifier input in the correct gain the phase to to promote cancellation of the distortion at the power amplifier's output.

Feed forward techniques such as those attempted by U.S. Pat. No. 3,922,617 for Adaptive Feed Forward System issued to Denniston et al., U.S. Pat. No. 4,885,551 for Feed Forward Linear Amplifier issued to Myer, U.S. Pat. No. 5,130,663 for Feed Forward Amplifier Network With Frequency Swept Pilot Tone issued to Tattersall, Jr., U.S. Pat. No. 5,166,634 for Feed-Forward Amplifier issued to Narahashi et al., U.S. Pat. No. 5,304,945 for Low-Distortion Feed-Forward Amplifier issued to Myer, U.S. Pat. No. 5,327,096 for Control Circuit For Automatically Controlled Feed Forward Nonlinear Distortion Compensation Amplifier issued to Sakamoto et al., is and U.S. Pat. No. 5,455,537 for Feed Forward Amplifier issued to Larkin et al., are more advanced in seeking to separate the distortion generated by a power amplifier and add it back into the power amplifier's output with gain, phase and delay adjusted for maximum cancellation. We have found that the amount of reduction in distortion obtainable using feed forward is primarily limited by the accuracy of the gain and phase adjustments. In typical feed forward amplifier designs previously attempted, for example, in Denniston '617, Myer '551, Tattersall '663 and '022, Narahashi '634, and Larkin '537, a pilot signal is combined with an input signal. The power amplifier then amplifies both signals and introduces non-linear amplitude and phase distortion into both signals during the amplification process. The amplified signal is sampled and the sampled input signal is subtracted from the sampled amplified signal to extract the distortion in the sampled amplified signal. The extracted distortion which is known as an error signal, is then adjusted in amplitude and phase based upon the level of the pilot signal detected at the output of the feed forward amplifier network. The adjusted error signal is amplified and subtracted from the originally amplified signal to produce a corrected signal having less distortion than the originally amplified signal. Thus, these types of feed forward systems endeavor to reduce the distortion introduced by the high power amplifiers with a reduction in the level of the pilot signal in the power amplifier's output. The pilot signal is used to monitor the level of non-linear distortion contained in the corrected signal and to continuously suppress the phase and gain of the error amplifier regardless of design factors. We have found however, that complex and costly circuitry such as a pilot tone generator and a pilot tone detector are required to enable the amplifier to generate and receive the pilot signal.

While there are other designs for high power amplifiers that seek to reduce intermodulation distortion in an ouput signal without using a pilot system such as that recently disclosed in U.S. Pat. No. 5,491,454 for Method And Apparatus For Reducing Distortion In An Output Signal Of An Amplifier issued to Matz, we have observed that a need still exists for an improved linear power amplifier that can reliably effectively remove intermodulation distortion in an output signal using a relatively simple circuit.

SUMMARY OF THE INVENTION

Accordingly, it is therefore an object of the present invention to provide an improved linear power amplifier for effectively removing intermodulation distortion in an output signal.

It is another object to provide a linear power amplifier and method for suppressing intermodulation distortion generated in a main amplifier with a predistortion system and for suppressing the intermodulation distortion contained in an output amplified signal.

It is yet another object to provide a linear power amplifier that generates and superimposes a predistortion signal to a main amplifier and that feeds remnants of intermodulation distortion forward to an output port so as to suppress intermodulation distortion contained in amplifier signal at that port.

It is still another object of the present invention to provide a linear power amplifier having a predistortion system incorporated at a front terminal of the amplifier for generating and applying a predistortion signal to a main amplifier so as to suppress the intermodulation distortion generated in the main amplifier, and a feed forward system incorporated into a back terminal of the amplifier for extracting the remaining intermodulation distortion so as to suppress the intermodulation distortion contained in an output amplified signal.

These and other objects of the present invention can be achieved by a linear power amplifier having a main power amplifier including an input terminal for receiving an input signal and an output terminal for providing an amplified output signal. A predistortion system is connected to said input terminal in a main signal path to initially suppress distortion produced by the main power amplifier by distorting the input signal applied to the main power amplifier in order to generate a predistortion signal having the input signal included therein representing an induced distortion that is complementary to the distortion, in terms of amplitude and phase, produced by the main power amplifier. The main power amplifier is connected to the predistortion system in the main signal path for amplifying the predistortion signal to generate a power amplified signal. A feed forward system is connected to the input terminal and the output terminal in a sub signal path to finally suppress the distortion produced by the main power amplifier by canceling the input signal and the power amplified signal in order to generate an error signal representing the distortion produced by the main power amplifier, error amplifying the error signal to generate an amplified error signal, and combining the amplified error signal with the power amplified signal to generate the amplified output signal at the output terminal.

Alternatively, the present invention may be implemented in practice by a process of eliminating an intermodulation signal of a linear power amplifier which includes a main power amplifier, suppressing the intermodulation signal generated upon amplification of an RF signal in the main power amplifier, by generating a harmonics corresponding to the input RF signal and a predistortion signal with coupling the RF signal to the harmonics; and suppressing the intermodulation signal by canceling the input RF signal and the output of the main power amplifier, extracting an intermodulation signal distortion, error-amplifying the extracted intermodulation signal distortion, and coupling the amplified intermodulation signal with the output of the main power amplifier.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
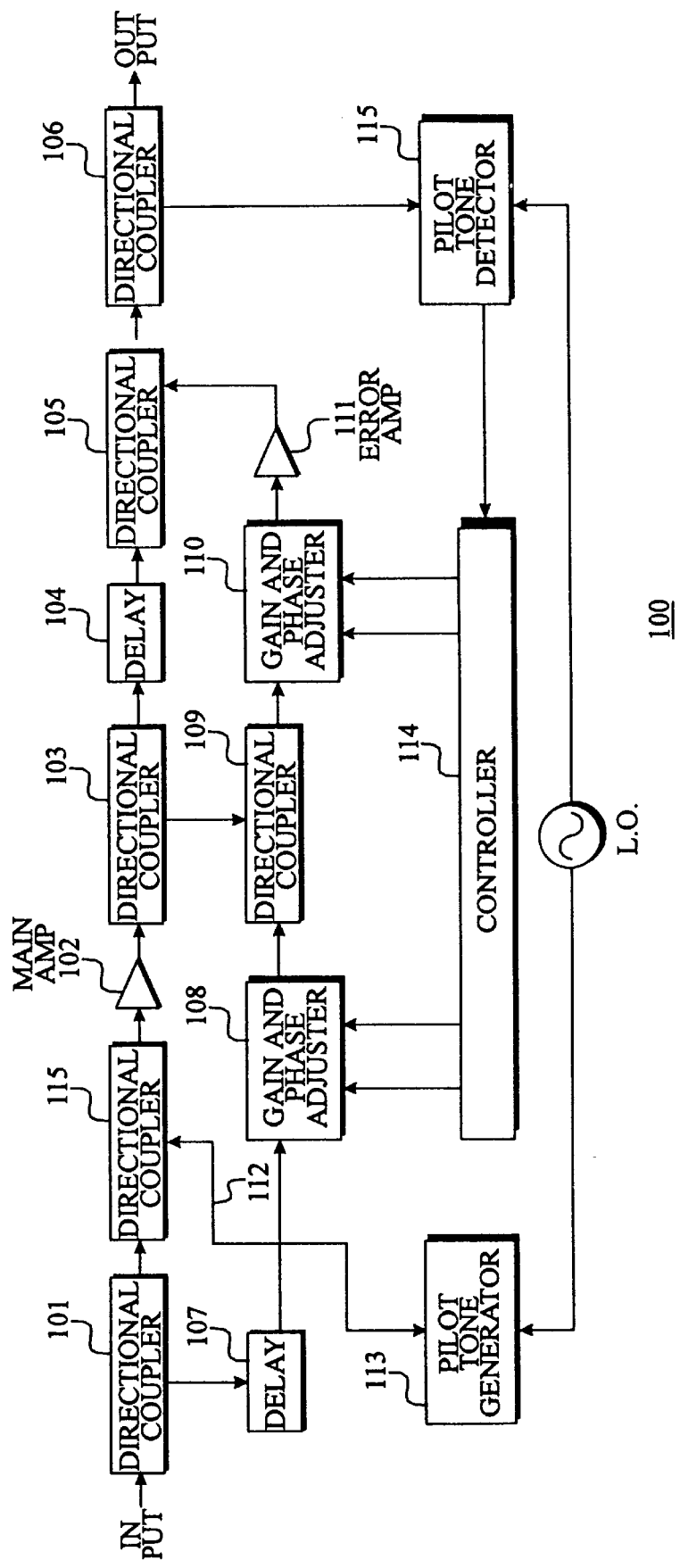
FIG. 1 is a block diagram illustrating a typical linear power amplifier using a pilot signal.

Referring now to the drawings and particularly to FIG. 1, which illustrates an abstract representation of a typical linear power amplifier 100 such as that found in the previously mentioned Tattersall, U.S. Pat. No. 5130,663 issued 14 Jul. 1992, using a pilot signal for reducing intermodulation distortion in an output signal. Generally, the linear power amplifier 100 requires an input signal, which may comprise a plurality of radio frequency (i.e., RF) carriers, to be routed between a main signal path and a feed forward signal path by directional coupler 101. In the main signal path, the input signal is amplified in main amplifier 102 and is subsequently output through directional coupler 103, delay circuit 104 and directional couplers 105 and 106. In the feed forward signal path, the input signal is delayed by delay circuit 107, and then phase and gain adjusted by phase and gain adjuster 108. The time delay of delay circuit 107 is set to compensate for the signal delay through main amplifier 102 and directional coupler 203.

Directional couplers 103 and 109 then permits a portion of the amplified signal having a distortion component to be combined with the signal fed forward. If the amplitude and the phase of the being input signal fed forward are properly adjusted by controller 114, the carrier components of the amplified signal from directional coupler 203 will cancel the carrier components of the input signal fed forward, resulting in an error signal at the output of directional coupler 109. Thereafter, the amplitude and phase of the error signal are modified in amplitude and phase adjuster 110, amplified in error amplifier 111 and routed to directional coupler 105 for distortion cancellation. The time delay introduced by delay circuit 104 is set to compensate for the signal delay through directional coupler 109, gain and phase adjuster 110, and error amplifier 111. When the amplitude and phase of the error signal are properly adjusted, the distortion component of the main signal path will be canceled.

Pilot tone generator 113 generates a frequency swept pilot signal 112 which is injected into the main signal path via directional coupler 115 and delivered to main amplifier 102. The pilot signal has a fixed or variable frequency generated in response to a local clock or local oscillator. The amplitude of the pilot signal 112 is controlled to be equal to the level of the distortion components generated by the main amplifier 102. Consequently, the error signal at the output of directional coupler 109 is substantially representative of the distortion components introduced by the main amplifier 102 and the pilot signal 112. This pilot signal 112 is essentially used to cancel the distortion components of equal amplitude in the main signal path to produce a clean output signal. The pilot tone detector 115 is used to determine the extent of pilot tone cancellation. In operation, the pilot tone detector 115 is synchronized with the pilot tone generator 113 to identify the pilot signal despite the presence of additional signals in the main amplifier output path.

As described, the pilot signal is used to continuously suppress the phase and gain of the error amplifier in the linear power amplifier regardless of design factors. However, complex and costly circuitry such as the pilot tone generator and the pilot tone detector, is necessarily required to generate and receive the pilot signal. This requirement is not only burdensome and highly undesirable, by is a continuous source of error and signal distortion.

Figure 2:
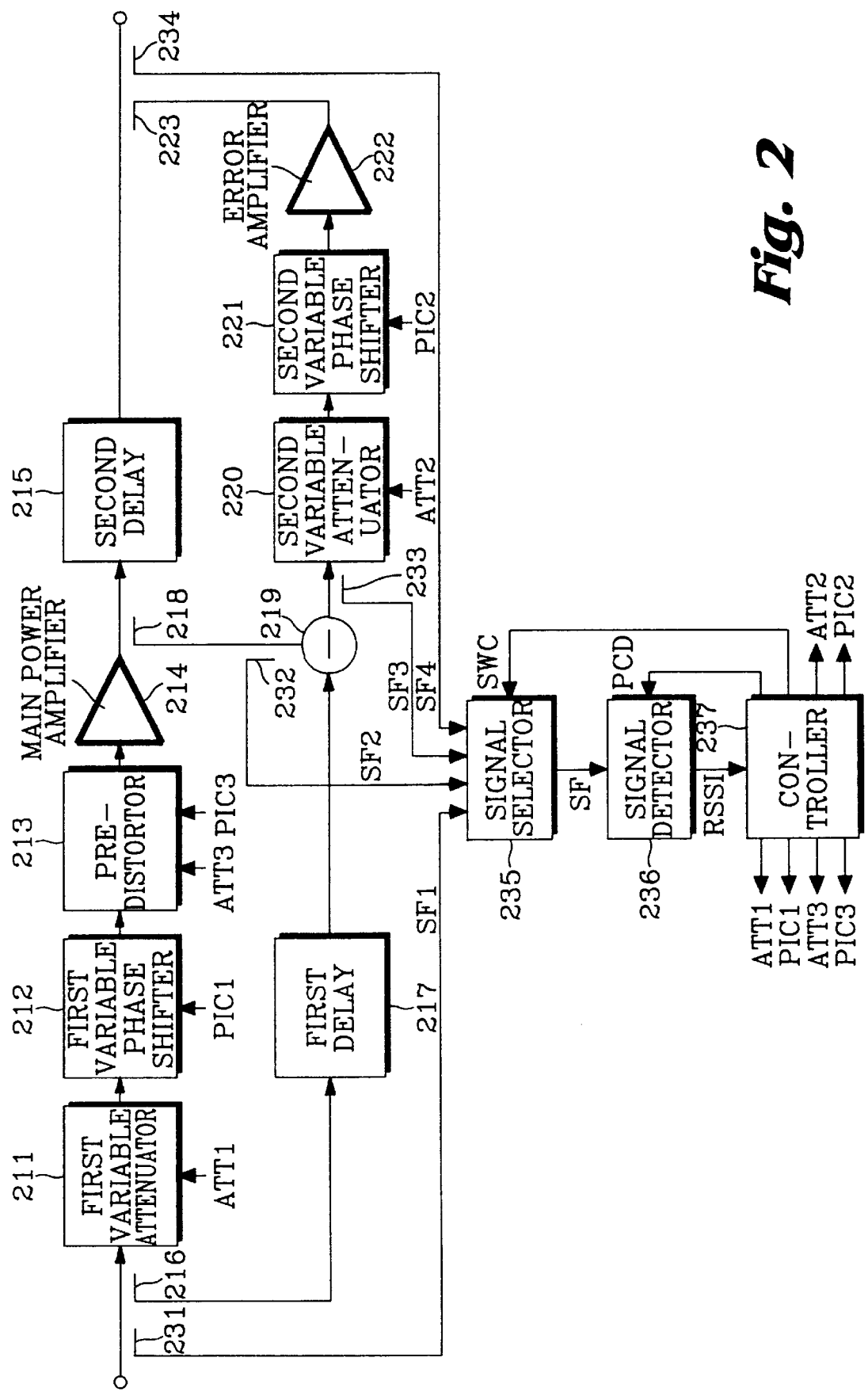
FIG. 2 is a block diagram illustrating a linear power amplifier constructed according to a first embodiment of the present invention.

Turning now to FIG. 2 which illustrates a linear power amplifier constructed according to a first embodiment of the present invention. A first variable attenuator 211 controls the attenuation of the gain of an input RF signal in response to an attenuation control signal ATT1 in a main signal path. A first variable phase shifter 212 which is coupled to receive the output of the first variable attenuator 211, controls the phase of the input RF signal in response to a phase control signal PCI1.

A predistortor 213 generates a distortion signal based on reception of the input radio frequency signal and determination that harmonics as the intermodulation distortion to be generated in a main power amplifier 214 of an output terminal. The main power amplifier 214 amplifies the input RF signal received from the predistortor 213 to produce a power-amplified signal in a main signal path. A second delay unit 215 receives the RF signal from the main power amplifier 214, delays and outputs the input radio frequency signal during the time when the intermodulation signal is applied.

A power divider 216 sometimes constructed in a form of a directional coupler divides the input RF signal input to the main signal path into the first variable attenuator 211 and to a sub signal path to a first delay 217. The first delay 217 compensates for the delay time of the RF signal in the predistortion and amplification process of the main signal path. A power divider 218 is positioned at an output terminal of the main power amplifier 214 and divides the output of the main power amplifier 214 to be output. Like the power divider 216, the directional coupler can be used as the power divider 218. A signal canceler 219 receives the RF signal from the first delay 217 and the amplified RF signal from the main power amplifier 214. The signal canceler 219 cancels the RF signal from the first delay 217 from the amplified RF signal from the main power amplifier 214 so as to detect the intermodulation signal. In this embodiment of the present invention, the signal canceler 219 is constructed as a subtractor.

A second variable attenuator 220 receives the intermodulation signal from the signal canceler 219 and controls the gain of the intermodulation signal with an attenuation control signal ATT2 from a controller 237. A second variable phase shifter 221 receives the intermodulation signal from the second variable attenuator 220 and controls the phase of the intermodulation signal with a phase control signal PIC2 from the controller 237. An error amplifier 222 amplifies the intermodulation signal from the second variable phase shifter 221 and outputs the amplified intermodulation signal. A signal coupler 223 couples the output of the error amplifier 222 to the output terminal of the second delay 215. A directional coupler can be used as the signal coupler 223. The construction as described corresponds to the sub-signal path for suppressing the intermodulation signal of the main signal path in this preferred embodiment of the present invention.

A power divider 231 routes the input RF signal received from the input terminal to produce a first signal SF1. A power divider 232 is disposed at the output terminal of the main power amplifier 214, routes the amplified RF signal to produce a second signal SF2. A power divider 233 positioned at the output of the signal canceler 219, routes the intermodulation signal after the RF signal is canceled, to produce a third signal SF3. A power divider 234 is provided at the output terminal, routes the finally output RF signal to produce a fourth signal SF4. The power dividers 231 to 234 can be replaced with directional couplers. A signal selector 235 receives the first to fourth signals SF1 to SF4 output from the power dividers 231 to 234 to selectively produce a signal SF corresponding to control by switching control data SWC output from the controller 237.

A signal detector 236 detects a received signal strength indicator (RSSI) of the signal SF from the signal selector 235 under the control of data PCD (PLL control data) from the controller 237 and then outputs to controller 237 the RSSI signal which is converted into direct current. The controller 237 generates the switching control signal SWC for selection of the signal SF pertaining to the signal selector 235 and thus, the control data PCD for determining the frequency for detection of the RSSI of the signal SF selected by the signal detector 236.

Additionally, the controller 237 analyzes the value of the RSSI signal from the signal detector 236 and generates the attenuation control signals ATT1 to ATT3 and the phase control signals PIC1 to PIC3 for controlling the variable attenuator and the variable phase shift in order to adjust the gain and the phase of the signal SF in correspondence with the analyzed result provided by controller 237. Most of all, in the case that the input RF signal from the power divider 231 is selected, the controller 237 controls the signal detector 236, detects the RSSIs of the input RF signal, and judges the size of the RSSIs, so that the frequency component of the input RF signal can be recognized, accordingly. In the case that the output of the main power amplifier 214 from the power divider 232 is selected, the controller 237 controls the signal detector 236, detects the RSSIs of the harmonics signal of the amplified RF signal, and judges the size of the RSSIs for as to generate an attenuation control signal ATT3 and a phase control signal PIC3 for adjusting the attenuation and the phase of the intermodulation signal output from the predistortor 213. Secondly, when the output of the signal canceler 219 is selected, the controller 237 controls the signal detector 236, detects the RSSIs of the RF signal contained in the canceled intermodulation signal, and judges the size of the RSSIs so as to generate the attenuation control signal ATT1 and the phase control signal PIC1 for adjusting the attenuation and the phase of the RF signal input in the input terminal of the linear power amplifier. Thirdly, when the amplification signal finally output is selected, the controller 237 controls the signal detector 236, detects the RSSIs of the intermodulation signals contained in the finally output amplified signal, and judges the size of the RSSIs so as to generate the attenuation control signal ATF2 and the phase control signal PIC2 for adjusting the attenuation and the phase of the intermodulation signal from the signal canceler 219.

According to a preferred embodiment of the present invention as constructed above, the linear power amplifier eliminates the intermodulation signal which can occur in the amplification step by using the predistortion system and the feed forward system. In the above embodiment of the present invention, the predistortor 213 firstly performs the function of removing the intermodulation signal which is delivered to the main power amplifier 214. In order to remove the intermodulation distortion generated in the main power amplifier 214, the predistortor 213 previously expects the harmonics which can be generated upon amplification in the main power amplifier 214 to be generated, to then adjust the phase thereof so as to have the back phase with the harmonics capable of being generated in the main power amplifier 214 at the time when the harmonics is applied to the power transistor of the main power amplifier 214.

While the predistortion system is advantageously used to reduce the intermodulation distortion produced in the linear power amplifier, the intermodulation distortion contained therein can not be completely eliminated. As a result, the linear power amplifier constructed according to the embodiment of the present invention, firstly suppresses the intermodulation distortion with the predistortor 213, and then finally suppresses the intermodulation signal distortion with the feed forward system. The linear power amplifier using the feed forward system, cancels the pure RF signal distortion in the output of the main power amplifier 214, extracts the intermodulation signal, and couples the extracted intermodulation signal to the signal coupler 223 so as to completely cancel the intermodulation distortion contained in the finally output amplified signal. Therefore, when using the feed forward system, the intermodulation signal distortion contained in the amplified signal at the output terminal of the linear power amplifier can be wholly suppressed, so that a clean amplified RF signal free of any intermodulation distortion can be produced.

In the embodiment of the present invention as explained above, the intermodulation signal generated in the amplification of the main power amplifier 214 is firstly suppressed using the predistortion system, and the intermodulation distortion signal contained in the output of the main power amplifier 214 is secondly suppressed using the feed forward system. Herein, for the convenience of explanation, after the operation for suppressing the intermodulation signal by the predistortion system may be observed, it is intended that the observation on the operation for suppressing the intermodulation signal by the feed forward system may be followed.

Figure 6A:
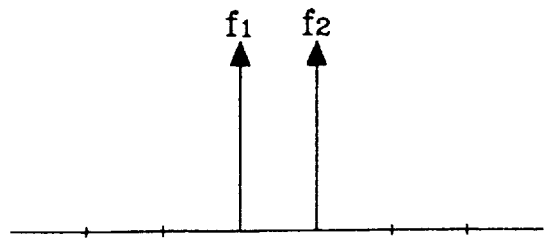
FIGS. 6A through 6G show signal spectra illustrating the operation of the linear power amplifier shown in FIG. 2.
Figure 6B:
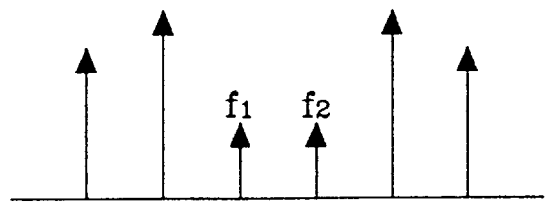
Figure 6C:
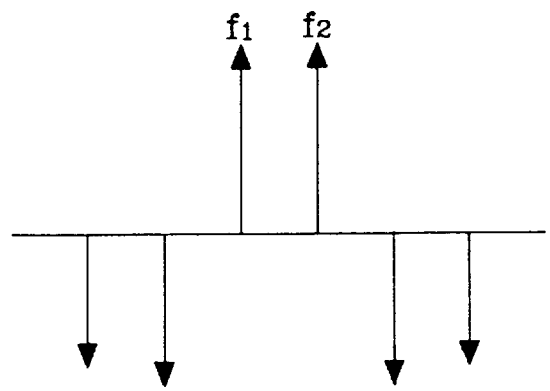
Figure 6D:
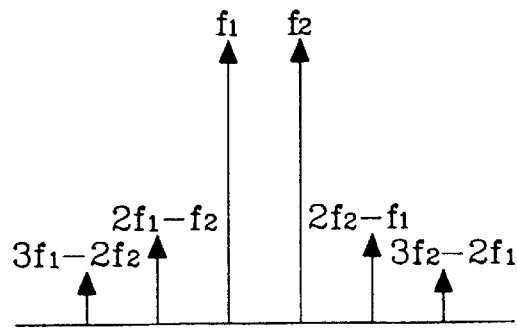
Figure 6E:
Figure 6F:
Figure 6G:
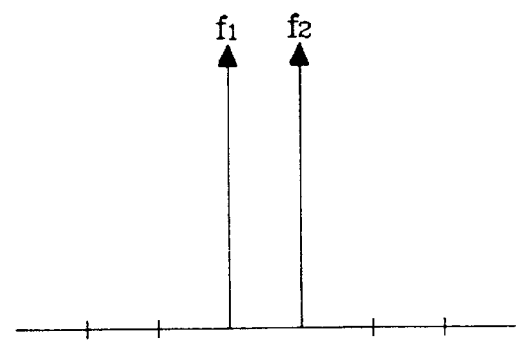

FIGS. 6A through 6G illustrate a frequency spectrum of two channel frequencies for explaining operation of the linear power amplifier according to a first embodiment of the present invention as shown in FIG. 2. FIG. 6A illustrates a frequency of the input RF signal. FIG. 6B illustrates harmonics of the input RF signal generated in a harmonic generator 314. FIG. 6C illustrates a signal which adjusts the size of the harmonics by a variable attenuator 315 in the predistortor 213 and adjusts by back phase of the main power amplifier 214 by means of a variable phase shift 316. FIG. 6D illustrates an amplified RF signal containing the intermodulation signal by amplifying the predistortion signal input in the main power amplifier 214 as shown in FIG. 6C. FIG. 6E illustrates an intermodulation signal extracted by canceling the signal distortion component present in the amplification signal RF in the signal canceler 219 as shown in FIG. 6A. FIG. 6F illustrates a signal which adjusts the size of the intermodulation signal as shown in FIG. 6E and adjusts by back phase with the output of the main power amplifier 215 as shown in 6D, and FIG. 6G illustrates a final output amplified signal which suppresses the intermodulation signal by coupling the intermodulation signal extracted as shown in FIG. 6D and the RF signal amplified as shown in FIG. 6D, to each other with their back phase.

Figure 3:
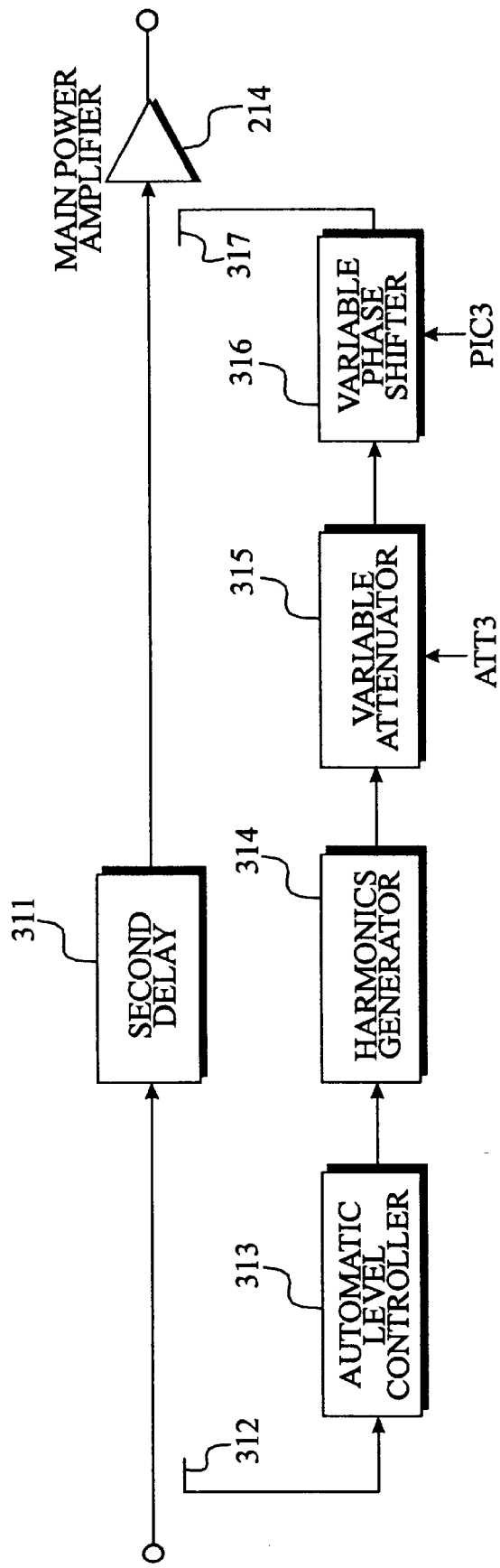
FIG. 3 is a block diagram of a predistortor for the linear power amplifier shown in FIG. 2.

FIG. 3 illustrates a construction of the predistortor 213 of the linear power amplifier as shown in FIG. 2. The predistortor 213 includes a power divider 312 for dividing the RF signal component present in the input terminal to produce the divided RF signal. An automatic level controller (ALC) constantly maintains the level of the input RF signal in order to generate the constant harmonics regardless of the variation of the level of the input RF signal. The harmonic generator 314 inputs the RF signal which adjusts the level of the RF signal in the automatic level controller 313 and generates third, fifth, seventh, and high harmonics of the RF signal. A variable attenuator 315 inputs the harmonics signal from the harmonics generator 314 and controls the gain of the harmonics distortion with the attenuation control signal ATT3 from the controller 237. The variable phase shifter 316 inputs the harmonics signal with the harmonics distortion of the phase control signal PIC3 output from the controller 237. A second delay 311 delays the input RF signal through the main path during the period of time when the predistortion signal occurs. A signal coupler 317 is positioned between the output terminal of the second delay 311 and the input terminal of the main power amplifier 214, thereby coupling the predistortion signal to the delayed RF signal.

Referring to FIG. 3, the harmonics generator 314 is constructed with a signal coupler and a Schottky diode. Then, when the RF signal is input to the Schottky diode, the Schottky diode generates the high harmonics in accordance with the level of the input RF signal. Consequently, the level of the input RF signal to the Schottky diode should be set as a level that can most effectively suppress the intermodulation signal included in the output of the main power amplifier 214. For this reason, the automatic level controller 313 is positioned in the front terminal of the harmonics generator 314 so that the RF signal can always be input with the given level.

Figure 4:
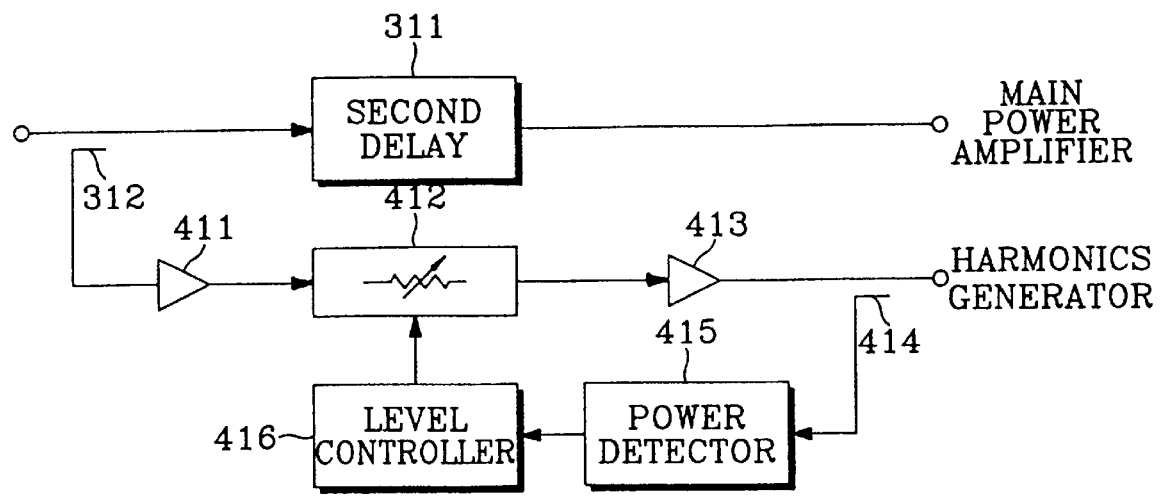
FIG. 4 is a block diagram of an automatic level controller for the predistortor shown in FIG. 3.

The automatic level controller 313 controls and outputs the RF signal of the given level set regardless of the variation of the level of the input RF signal to the linear power amplifier. FIG. 4 is a view showing the construction of the automatic level controller 313 of FIG. 3, where a variable attenuator 412 is connected between the power divider 312 and the harmonic generator 314. Power divider 414 is disposed at the input terminal of the harmonics generator 314, which conclusively divides and outputs an RF signal having an adjusted level that was being applied to the harmonic generator 314. In this case, a power detector 415 converts the RF signal into a DC voltage and thus outputs the converted signal to a level controller 416. Thus, a level controller 416 controls the variable attenuator 412 according to the DC voltage applied to the power detector 415, so that the RF signal always having a given level, can be input to the harmonics generator 314.

Figure 5:
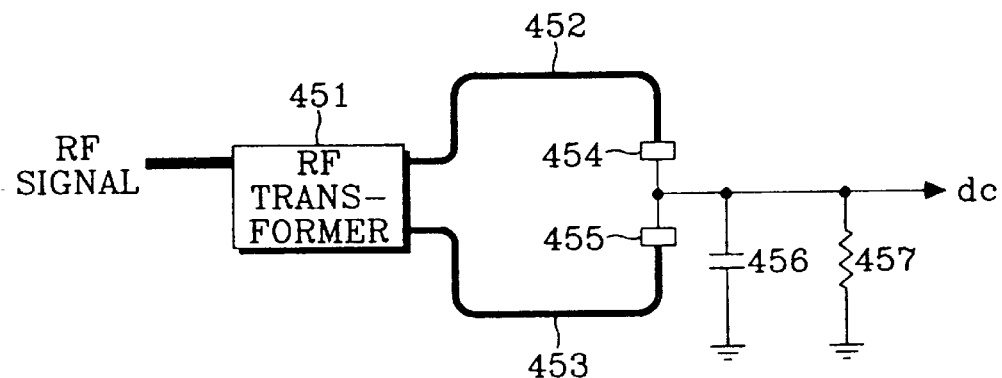
FIG. 5 is a circuit schematic of a power detector for the automatic level controller shown in FIG. 4.

Herein, the power detector 415 of FIG. 4 should sense the multi-carrier. Namely, the power detector 415 should input the RF signal for the multi-carrier and convert the input RF signal into the DC voltage. FIG. 5 is a view showing the construction of the power detector 415 of FIG. 4, where an RF transformer 451 inputs the RF signal and generates two signals having a phase difference of 180° with each other, the two signals from the RF transformer 451 are converted from transmission lines 452 and 453 through the Schottky diodes 454 and 455 into the DC level, thereby synthetically filtering the converted signal through a filter formed by a capacitor 456 and a resistor 457, and outputting the filtered signal as the DC voltage.

With reference to FIGS. 3 and 4, regarding the operation for controlling the level of the input RF signal, the RF transformer 451 for generating the signals with a phase difference of 180° of the power detector 415 generates two signals by separating the input RF signal by a unit of a semi-diameter (i.e. by 180°). Further, the Schottky diodes 454 and 455 convert the two input signals via the transmission lines 452 and 453 into the DC level, respectively. Accordingly, the average power of the multi-carrier can be sensed without error, so that the level of the input RF signal to the harmonics generator 314 can exactly be converted into the DC voltage.

At this point, the level controller 416 generates the control signal depending on the level of the DC voltage of the RF signal from the power detector 415 and applies the generated control signal to the variable attenuator 412. The level controller 314 can be embodied using an OP amplifier. At this time, the control signal output from the level controller 416 is generated to enable the attenuation control to be performed more upon the voltage is increased in accordance with the DC voltage of the detected RF signal and enable the attenuation control to be performed less upon the voltage is decreased therein. Thus, the variable attenuator 412 variably attenuates the RF signal to have its given level regardless of the level of the input RF signal and inputs the attenuated signal to the harmonics generator 314.

Then, when the variation of the level of the input RF signal is 10dB, the operation area of the automatic level controller 313 should be designed to control its level above the 10 dB, minimumly. In addition, the output level of the RF signal of the automatic level controller 313 should be set to optimumly suppress the intermodulation signal which the harmonic generator 314 generates in the main power amplifier 214, as the predistortion signal. Therefore, since the harmonic generator 314 which inputs the output of the automatic level controller 313, inputs the RF signal of the given level, the harmonics can stably occur. As well, inasmuch as the harmonics output from the harmonics generator 314 is input to the main power amplifier 214 coupled with the RF signal the main power amplifier 214 can prevent the generation of the intermodulation signal in steps of amplifying the RF signal.

Likewise, upon inputting the harmonics generated as above, to the main power amplifier 214, the size and the back phase of the harmonics capable of being generated in the amplification should be adjusted. The variable attenuator 315 and the variable phase shifter 315 as shown in FIG. 3, adjust the size of the harmonics generated as the size of the intermodulation signal capable of being generated in the amplification and the phase to input the harmonics having the adjusted size with back phase.

The controller 237 controls the signal selector 235 and selects the output of the main power amplifier 214 which is output from the power divider 232, and the signal detector 236 detects the RSSI of the intermodulation signal in the output of the main power amplifier 214 as shown in FIG. 6D. After comparing and analyzing the RSSI value of the intermodulation signal output from the signal detector 236 with the RSSI value of the previous state, the attenuation control signal ATT3 and the phase control signal PIC3 are generated so as to control the suppression of the intermodulation signal to be performed smoothly by the main power amplifier 214.

Then, the variable attenuator 315 adjusts the size of the predistortion signal generated in the harmonics generator 315 by the attenuation control signal ATT3, and the variable phase shifter 315 adjusts its phase so that the predistortion signal can be input with back phase to the main power amplifier 214. As adjusted above, the harmonics signal as shown in FIG. 6D which is generated in the harmonics generator 314, adjusts its size and phase, and the signal coupler 317 couples the intermodulation signal to the input terminal of the main power amplifier 214. At this moment, as shown in FIG. 6A, the second delay 311 for delaying the input RF signal, delays the RF signal till the predistortion signal is coupled to the input terminal of the main power amplifier 214. Thereafter, it is understood that the predistortion signal is coupled to the input terminal of the main power amplifier 214. Here, it is preferable to use the position where the intermodulation signal coupled to the RF signal as shown in FIG. 6C is adjusted with the back phase, as the input terminal of the power transistor of the main power amplifier 214.

As noted above, the predistortor 213 beforehand expects the intermodulation signal to be generated in the main power amplifier 214 to thereby generate the predistortion signal, and controls the phase and attenuation of the harmonics to prevent the intermodulation signal from being generated at a maximum value, thereby inputting the controlled attenuation and phase to the main power amplifier 214. In this event, the predistortor 213 mainly eliminates the third harmonics generated with highest level among the harmonics capable of being generated in the main power amplifier 214. The intermodulation signal elimination effect of the predistortion system can greatly reduce the load of distortion by adapting the feed forward system. Inasmuch as the adjustment of the feed forward system is very effective and different, the predistortion system is advantageous in consideration of the improvement of a number of dB.

Secondly, after firstly suppressing the intermodulation signal which is generated in the main power amplifier 214 by the predistortion system as mentioned previously, the intermodulation signal which is impossible to be completely suppressed by the predistortion system is secondly suppressed by the feed forward system. In above the feed forward system, the intermodulation signal of the main power amplifier 214 is eliminated by two steps. The first step concerns with the extraction of the pure intermodulation signal distortion by canceling the input RF signal and output of the main power amplifier 214. The second step seeks to cancel the intermodulation signal distortion in the output of the main power amplifier 214 after correcting the size and the phase of the extracted intermodulation signal, so as to reduce the intermodulation signal included in the signal which is finally output from the main power amplifier in a perfect manner.

Most of all, the explanation on the first step of the feed forward system will be given hereinafter. The power divider 216 on the sub signal path divides the input RF signal as shown in FIG. 6A in the sub-path, and the first delay unit 217 delays the RF signal divided in the power divider 216 during the time of the predistortion and RF amplification so as to apply the delayed signal to the signal canceler 219. Thus, the RF signal distortion as shown in FIG. 6A which is output from the first delay 217 is reciprocally canceled with the RF signal distortion of the amplification signal as shown in FIG. 6D which is divided in the power divider 218 so as to extract and output the pure intermodulation signal distortion.

As mentioned, the signal canceler 219 as the core construction of the feed forward system, is used to detect only the intermodulation signal distortion in the main power amplifier 214. The signal canceler 219 can be constructed as either a subtractor or an adder. When the signal canceler 219 is in a form of a subtractor, two RF signals to be input should be adjusted to have the same phase with each other. When the signal canceler 219 is in a form of an adder, the two RF signals to be input should be adjusted to have the back phase with each other. In a preferred embodiment of the present invention, the signal canceler 219 is embodied as not the subtractor, but as the adder. In this case, the subtractor has a signal coupler in an interior thereof, inputs one signal of two RF signals to be input to the signal coupler while having the same phase with the other signal, and converts the other signal thereof to have the back phase with the one signal so as to deliver the converted signal to the signal coupler. When the RF signal as illustrated in FIG. 6A and the RF signal amplified as illustrated in FIG. 6D are input to the signal canceler 219 embodied as the subtractor, the two RF signals distortion having their phases equal to each other, is converted to have their back phases with each other in an interior thereof. After that, the RF signal is canceled while passing through the signal coupler which can be formed by a Wilkinson combiner so as to produce only the intermodulation signal distortion.

At this point, each of levels and phases of two RF signals input to the signal canceler 219 can be exactly equal to each other. To ensure that the two input RF signals having the same levels and phases, the amplified RF signal output from the main power amplifier 214 of the main path and the RF signal to be input via the sub-path should be precisely accorded with the group delay as well as the characteristic of the flatness of the delay should be positive. That is, it is preferable that the phase distortion of the RF signal desirable to be canceled should be maximumly prevented from being generated.

When the levels and the phases of the RF signal output from the first delay 217 and the output of the main power amplifier 214 are not the same, the RF signal may not be precisely canceled in the signal canceler 219. To avoid the foregoing problem, the first variable attenuator 211 of the linear power amplifier as shown in FIG. 2 adjusts the level of the input PF signal by the attenuation control signal ATT1 output from the controller 237 and the second variable phase shifter 212 adjusts the phase of the input RF signal by the phase control signal PIC1 which is output from the controller 237. Accordingly, the first variable attenuator 211 and the second variable phase shifter 212 respectively, adjust to accord the phase and the level of the RF signal of the sub path with those of the RF signal of the main path. Thus, the signal canceler 219 cancels two input RF signals having the same levels and phases.

As mentioned previously, for the sake of controlling the phases and the levels of two RF signals, the controller 237 outputs the switch control signal SWC for selection of a third signal SF3, to the signal selector 235 and outputs the control data PCD for detection of the RSSI of the RF signal distortion of the third signal SF3 in the signal detector 236. As a result, the signal selector 235 selectively inputs the third signal SF3 as the output of the signal canceler 219, the output of the signal selector 219 being divided in the power divider 233, and the signal detector 236 generates the RSSI which converts the RF signal distortion of the third signal SF3 into the DC voltage. Then, the controller 237 generates the attenuation control signal ATT1 and the phase control signal PIC1 for attenuation of the RF signal distortion in the signal canceler 219.

Then, the first variable attenuator 211 attenuates the input RF signal by determining the attenuation ratio by way of the attenuation control signal ATT1, and the first phase variable phase shifter 212 adjusts the phase of the input RF signal by the phase control signal PIC1. Here, since the attenuation control signal ATT1 and the phase control signal PIC1 are generated after comparing and analyzing the RSSI of the RF signal to be output from the signal canceler 219 and the RSSI of the previous RSSI with each other, the first variable attenuator 211 and the first variable phase shifter 212 controls two RF signals as shown in FIGS. 6D and 6A so that the above RF signals can have the same phases and the levels with each other, finally.

The reason for canceling the RF signal distortion in the signal canceler 219 as stated before, is to have no influence on the error amplifier 222 positioned in the back terminal by greatly suppressing the RF signal and solely extracting the intermodulation signal distortion. Namely, if the output of the signal canceler 219 is changed and the RF signal is not effectively eliminated, the RF signal having the relatively large level is input to the error amplifier 222 and cause damage to the error amplifier 222.

Secondly, the explanation on the second step of the feed forward system will be given hereinafter. Therein, the intermodulation signal output from the signal canceler 219 as described above adjusts its phase and level through the second variable attenuator 220, the second variable phase shifter 221, and the error amplifier 222, and the intermodulation signal distortion included in the output of the main power amplifier is removed by inputting the adjusted signal to the main signal path. At this time, the intermodulation signal coupled by a signal coupler 223 should have the back phase of the output amplified signal.

Here, the controller 237 generates the switch control signal SWC for selecting the fourth signal SF4 as the finally output amplified signal which is divided in a power divider 234 and outputs the control data PCD for detection of the RSSI of the harmonics as the intermodulation signal of the fourth signal SF4. Thus, the signal selector 235 selectively outputs the fourth signal SF4 output from the power divider 234 by the switch control signal SWC and the signal detector 236 is applied to the controller 237 with detecting the RSSI of the harmonics of the fourth signal SF4 by the control data PCD. So then, the controller 237 compares and analyses the RSSI of the intermodulation signal included in the finally output amplified signal with the RSSI of the previous intermodulation signal, so that the attenuation control signal ATT2 and the phase control signal PIC2 for suppression of the intermodulation signal included in the finally output amplified signal can be generated depending on the analyzed result.

Therefore, the second variable attenuator 220 for inputting the output of the signal canceler 219 adjusts the level of the intermodulation signal by the attenuation control signal ATT2, and the second variable phase shifter 221 for inputting the signal outputted from the second variable attenuator 220 adjusts the phase of the intermodulation signal which is input by the phase control signal PIC2. At this moment, the second variable phase shifter 221 controls the phase of the intermodulation signal to have the back phase of the signal coupler 223 by means of the phase control signal PIC2. Thus, the error amplifier 222 connected between the second variable phase shifter 221 and the signal coupler 223 amplifies and outputs the intermodulation signal which has the level and the phase adjusted.

As discussed above, the linear power amplifier constructed according to the first embodiment of the present invention, uses a predistortion system and a feed forward system to completely suppress the intermodulation distortion signal contained in the amplification signal. For the sake of suppressing the intermodulation signal, the intermodulation signal capable of being generated in the main power amplifier 214 is beforehand suppressed by the predistortion system and thus the intermodulation signal included in the output of the main power amplifier 214 is detected by the feed forward system, thereby coupling the above detected signal to the finally output amplified signal and reducing the intermodulation signal in a sequential manner. In the case of eliminating the intermodulation signal using the feed forward system, because it is difficult to design and construct the main power amplifier 214 and the error amplifier 222, the intermodulation signal of the given size is previously suppressed by using the predistortor 213 and the rest of the intermodulation signals is eliminated by the feed forward system. As a result, the design and construction of the linear power amplifier can be facilitated.

Next, the steps of suppressing the intermodulation signal by using the feed forward system and the predistortion system centering on the controller 237 will concretely be described in the following description.

Figure 7:
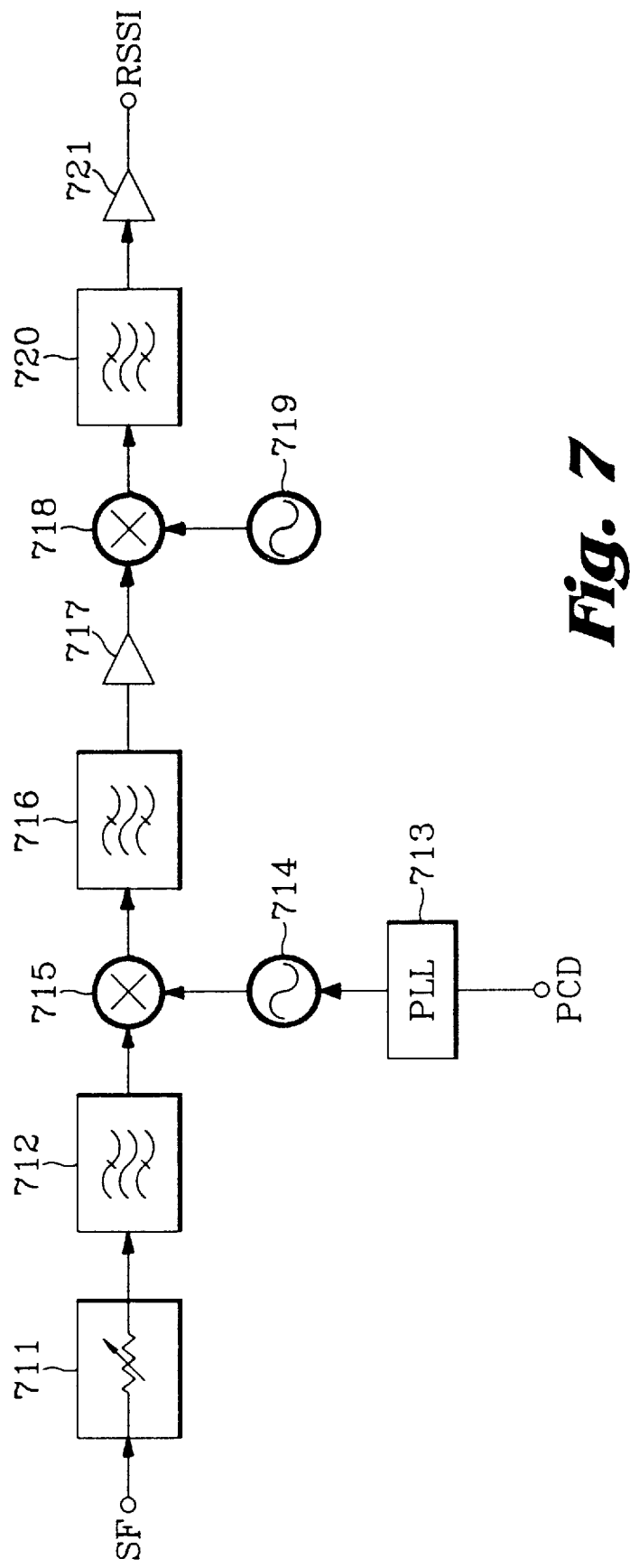
FIG. 7 is a block diagram of a signal detector for the linear power amplifier shown in FIG. 2.

FIG. 7 illustrates a construction of the signal detector 236 of the linear power amplifier as shown in FIG. 2 according to the present invention. The signal detector 236 includes an attenuator 711 for attenuating an SF signal output from the signal selector 235. A filter 712 in a form of a wideband filter, filters the signal of the transmission band. A phase lock loop (PLL) 713 and an oscillator 714 generate a corresponding local frequency LF1 by the control data PCD output from the controller 237. The local frequency LF1 is used to determine the frequency for detecting the RSSI of the selected SF signal. A mixer 715 mixes the signal output from the filter 712 with the local frequency LF1 and thus generates an intermediate frequency IF. A filter 716 in a form of an intermediate frequency filter, filters a subtraction signal SF-LF1 of two frequencies in the output of the mixer 715 so as to generate a filtered signal as an intermediate frequency LF1. An oscillator 719 generates the fixed local frequency LF2. The mixer 718 mixes the intermediate frequency LF1 output from the intermediate frequency amplifier 717 and the intermediate frequency IF2 to then generate the intermediate frequency IF2. A filter 720 filters a subtraction signal IF1–LF2 of two frequencies in the output of the mixer 718 and outputs the filtered signal as the local frequency LF2. A log amplifier 712 converts the intermediate frequency IF2 to be output from the filter 720 into the DC voltage and generates the converted voltage as the RSSI signal.

When observing the operation of FIG. 7, the signal selector 235 selectively outputs the corresponding RF signal among the first signal SF1 to the fourth signal SF4 by the switch control signal SWC of the controller 237. Thus, the filter 712 of the signal detector 236 filters the RF signal and applies the filtered signal RF to the mixer 715. And then, the PLL 713 and the oscillator 714 generate the local frequency LF1 for selection of the RF signal or the harmonics of the signal selected by the control data PCD 1 of the controller 237. Consequently, the mixer 715 mixedly outputs the SF signals and the local frequency LF1 and the filter 716 filters the frequency corresponding to the subtraction between two signals and outputs the filtered frequency as the intermediate frequency IF1. The construction as described above determines the frequency for detection of the RSSI in the selected SF signal and performs the frequency down conversion of the first step, at the same time.

Hereinafter, the mixer 118 mixes the local frequency LF2 and the intermediate frequency IF1 output from the oscillator 718 and the filter 720 filter the frequency corresponding to the subtraction between the intermediate frequency IF1 and the local frequency LF2 of the mixed signals so as to produce the filtered frequency as the intermediate frequency IF2. The frequency down conversion of the second step is performed by the above construction. The logic amplifier 721 receives the intermediate frequency IF2, converts the input intermediate frequency IF2 into the DC voltage to be output as the RSSI.

Figure 8:
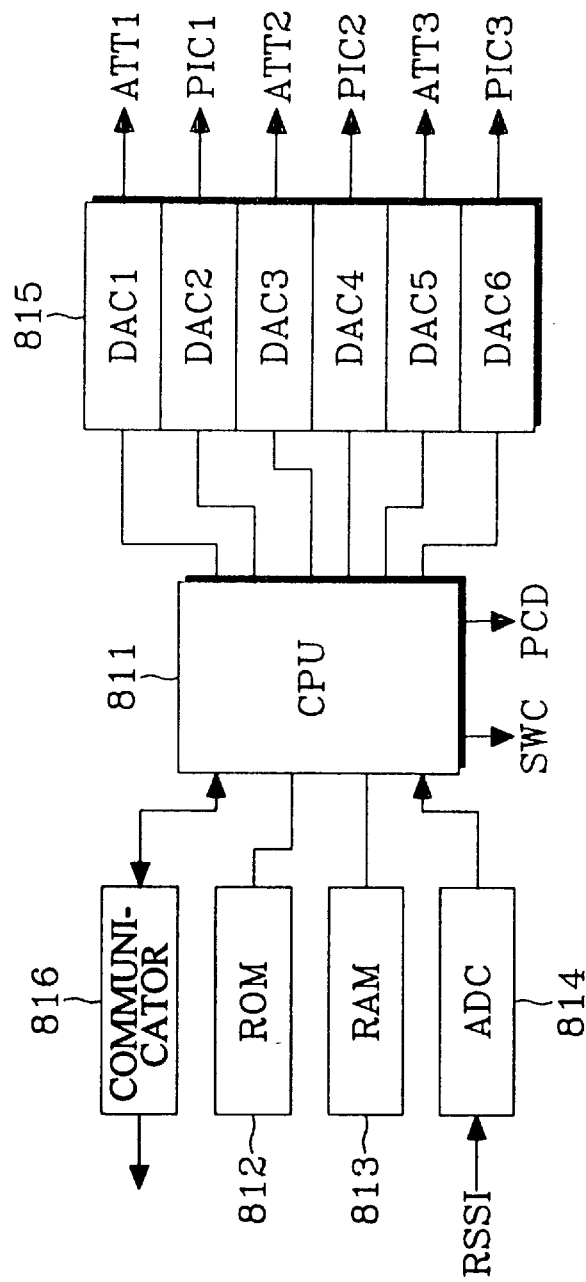
FIG. 8 is a block diagram of a controller for the linear power amplifier shown in FIG. 2.

FIG. 8 illustrates a construction of the controller 237 of the linear power amplifier as shown in FIG. 2 according to the present invention. The controller 237 includes an analog-to-digital converter 814 (ADC) for converting the RSSI output from the signal selector 236 into the digital data. A read-only-memory 812 (ROM) stores the program for controlling the attenuation and the phase in accordance with an embodiment of the present invention. A central processing unit 811 (CPU) generates the control data PCD for selection of the frequency to select the desired RSSI in the selected SF signal and the switch control signal SWC for selection of the RF signal in accordance with the program of the ROM 812, and generates the attenuation control signals ATT and the phase control signals PIC after comparing and analyzing the RSSI output from the ADC 814 with each other. A random-access-memory 813 (RAM) temporarily stores all kinds of data which are generated in the process of performing the program. A series of digital-to-analog converters 815 (DAC) convert the attenuation control data and the phase control data output from the controller 811 into analog data and generate the converted data as the attenuation control signals ATT1 to ATT3 and the phase control signals PIC1 to PIC3. A communicator 816 communicates state information of the linear power amplifier under the control of the CPU 816.

Figure 9:
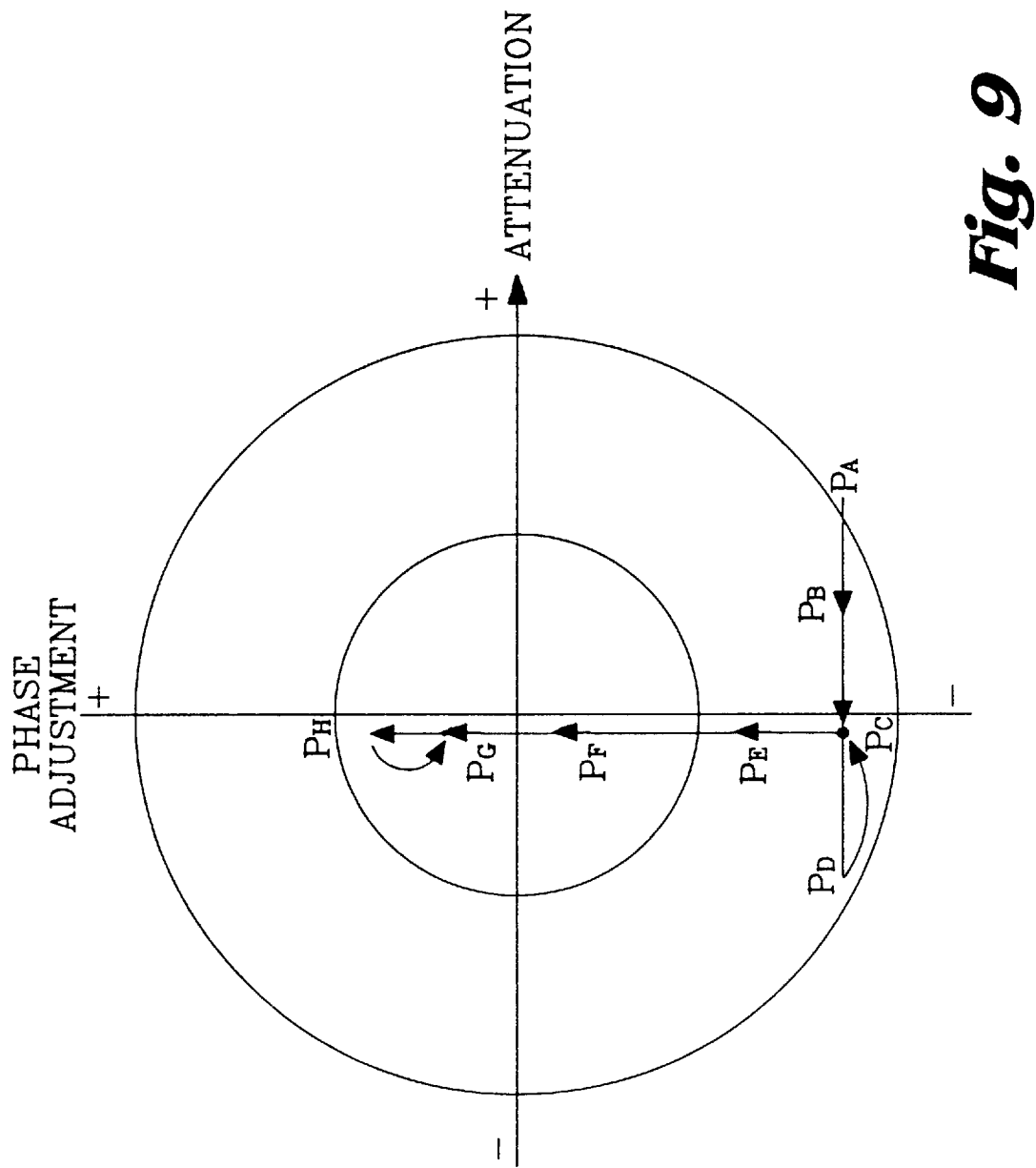
FIG. 9 is a diagram illustrating relations between amplitude and phase control of the controller according to the principles of the present invention.

FIG. 9 is a diagram for explaining amplitude level and phase control of the RSSI by the variable attenuators and the variable phase shifters under the control of the controller 237 according to an embodiment of the present invention. As shown in FIG. 9, "X" axis represents an attenuation value and "Y" axis represents a phase variation values. When the value of the variable attenuator is changed from a point Pa to Pb in response to the input RSSI, if the size of the detected signal is decreased, the phase variation value is changed from a point Pb to Pc. After that, when the value of the variable attenuator is changed from Pc to Pd at the point when the RSSI is input, if the detected signal is again increased, the phase variation value is changed in the direction of Pc. Herein, Pc represents a point when the size of the attenuation value is temporary. Accordingly, when the phase variation value is changed from a point Pc to Pe and the size of the detected RSSI is decreased, the variable phase shifter moves the phase variation value in the direction of Pf. When attenuation and phase operations are repeatedly controlled as described, the value of the variable attenuator and the variable phase shifter which the size of the detected SF signal is minimized.

FIGS. 10A to 10G are flow charts illustrating the operations of the variable attenuator and the variable phase shifter of the controller 237 according to an embodiment of the present invention. As set forth in FIG. 10, after the phase of the detected signal is controlled, the function of attenuating the signal is performed. However, it is possible to control the phase of the signal after attenuation of the signal.

Referring to FIGS. 10A to 10G, intermodulation distortion produced by the linear power amplifier is eliminated by four steps. Most of all, the RSSI of the first signal SF1 is detected, a channel where the RF signal is detected in the transmitting band is set, thereby determining service channels. Secondly, the RSSI of the second signal SF2 is detected and the main power amplifier 214 suppresses the intermodulation signal to amplify the received RF signal so as to generate the predistortion signal. Thirdly, the RSSI of the third signal SF3 is detected and thus, the intermodulation signal of canceling the RF signal distortion in the signal canceler 219 is detected. Fourthly, the RSSI of the fourth signal SF4 is detected and the intermodulation signal contained in the finally output amplified signal which is output from the main power amplifier 214 on the main path can be controlled to be suppressed.

Figure 10A:
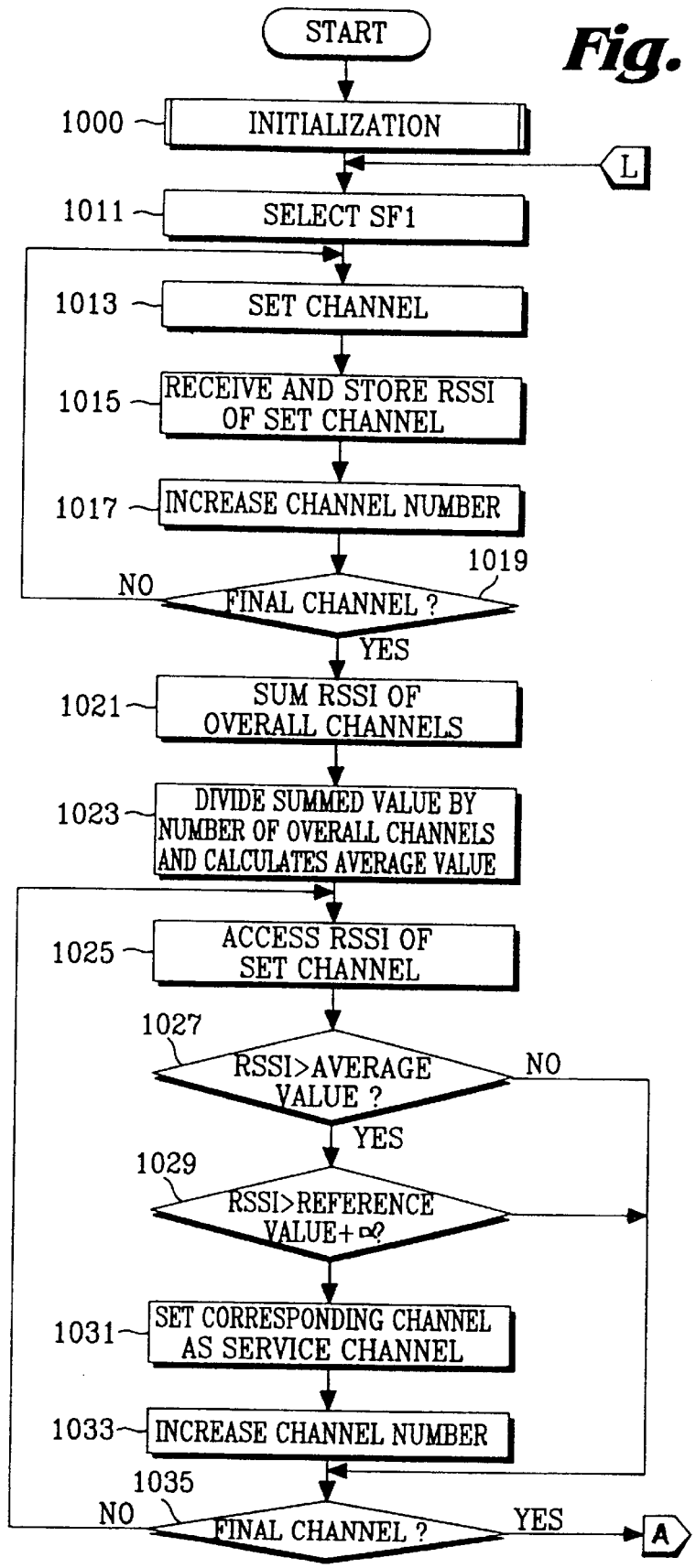
FIGS. 10A, 10B, 10C, 10D, 10E, 10F, and 10G provide a flowchart illustrating operation of controlling a variable attenuator and a variable phase shifter of the linear power amplifier shown in FIG. 2.
Figure 10B:
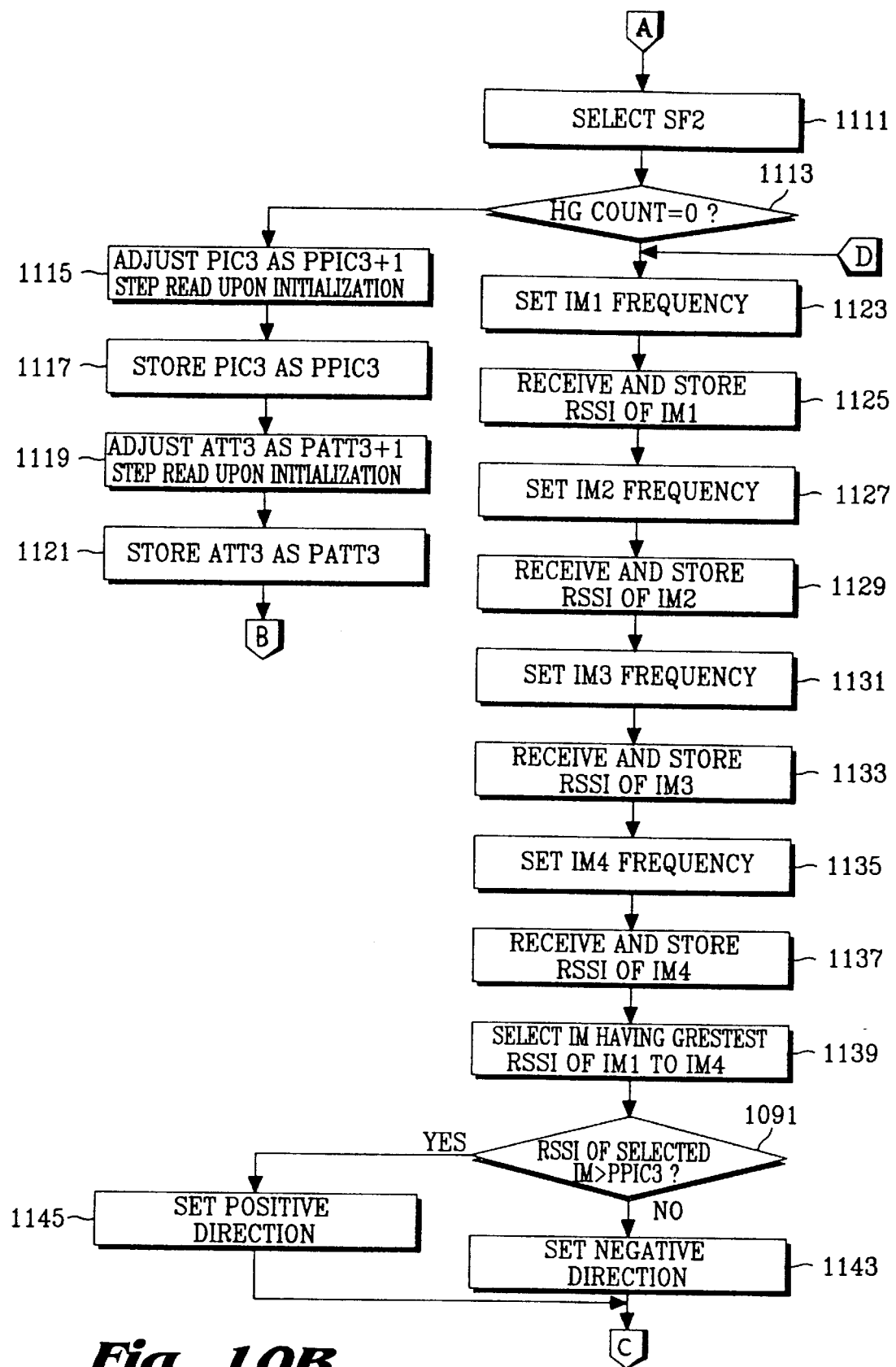
Figure 10C:
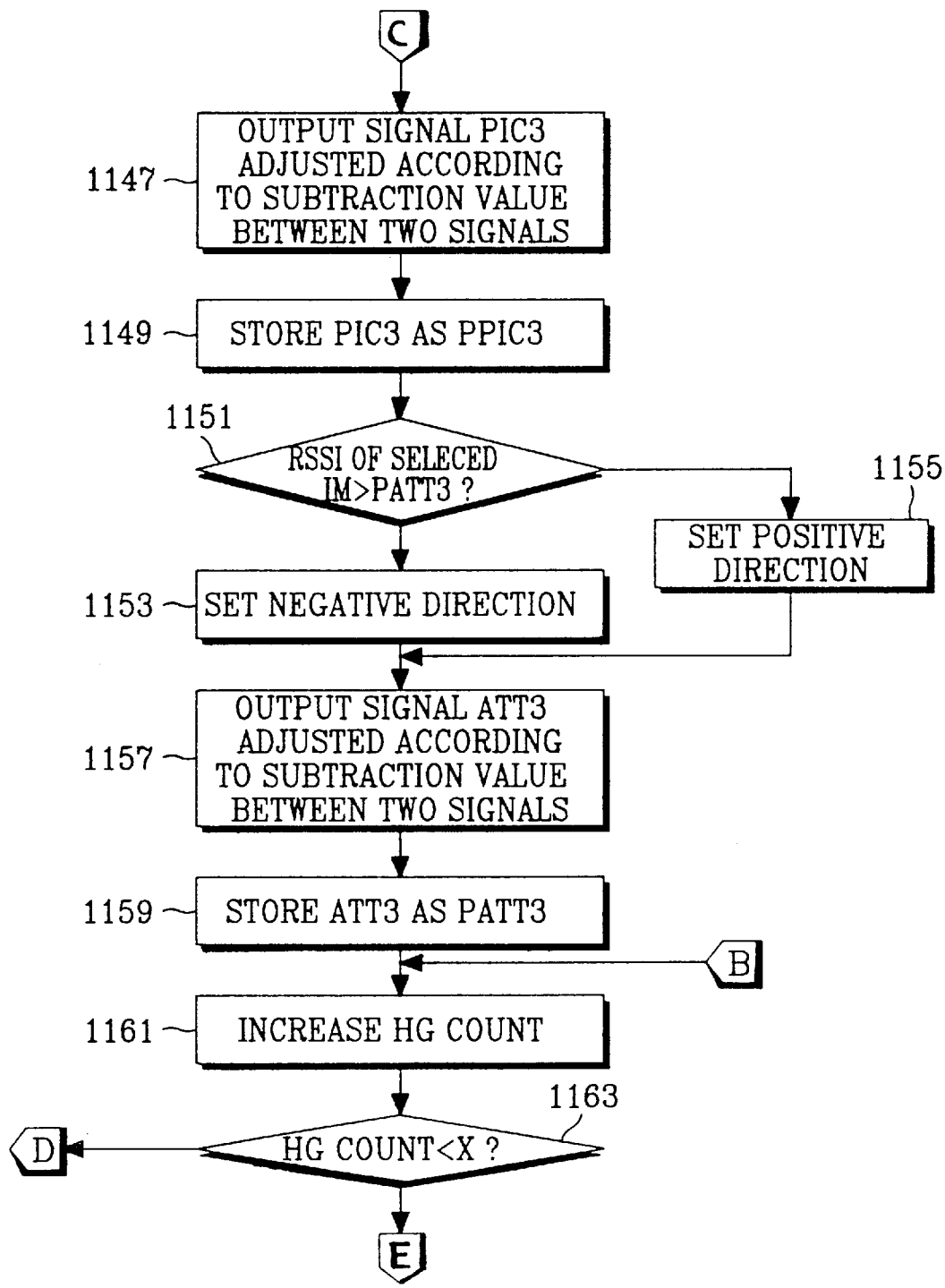
Figure 10D:
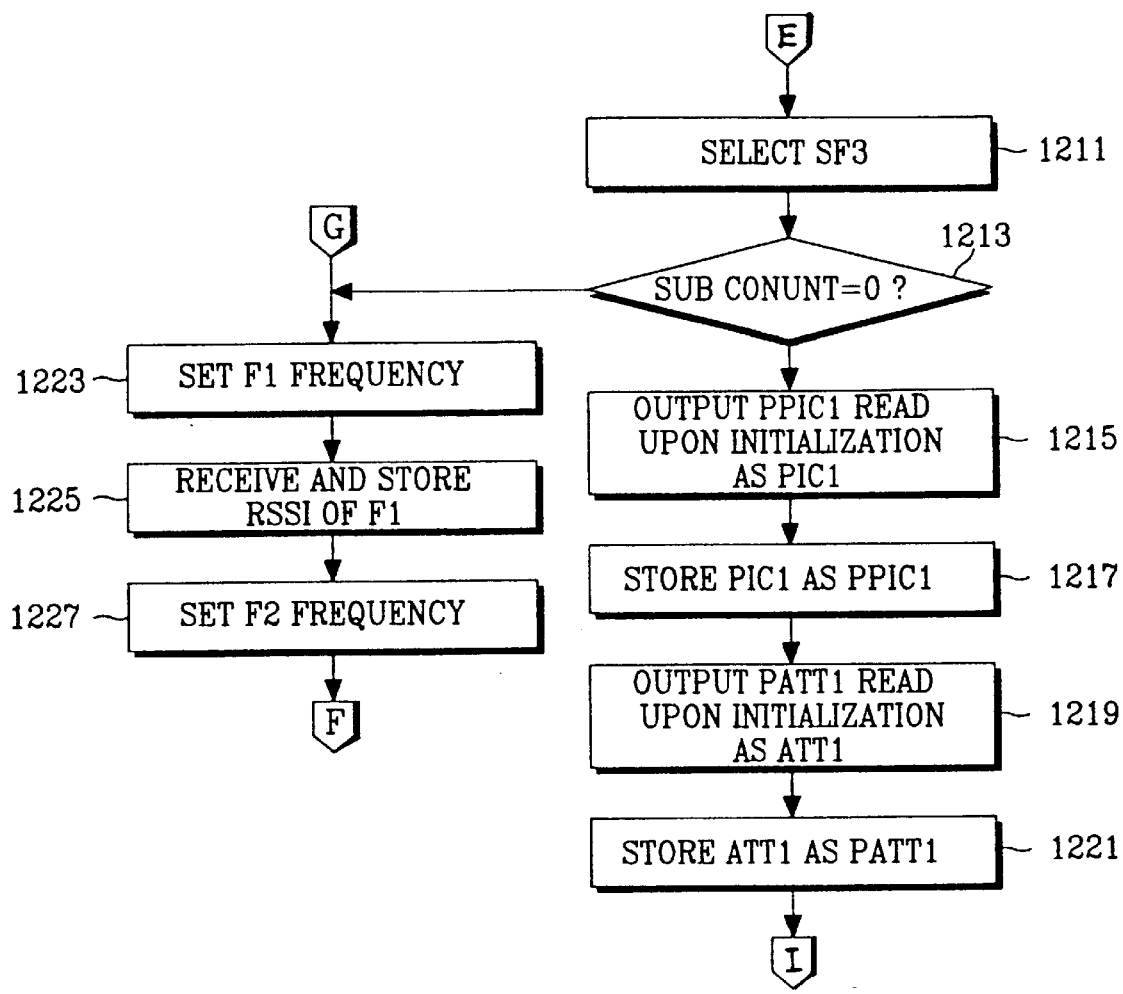
Figure 10E:
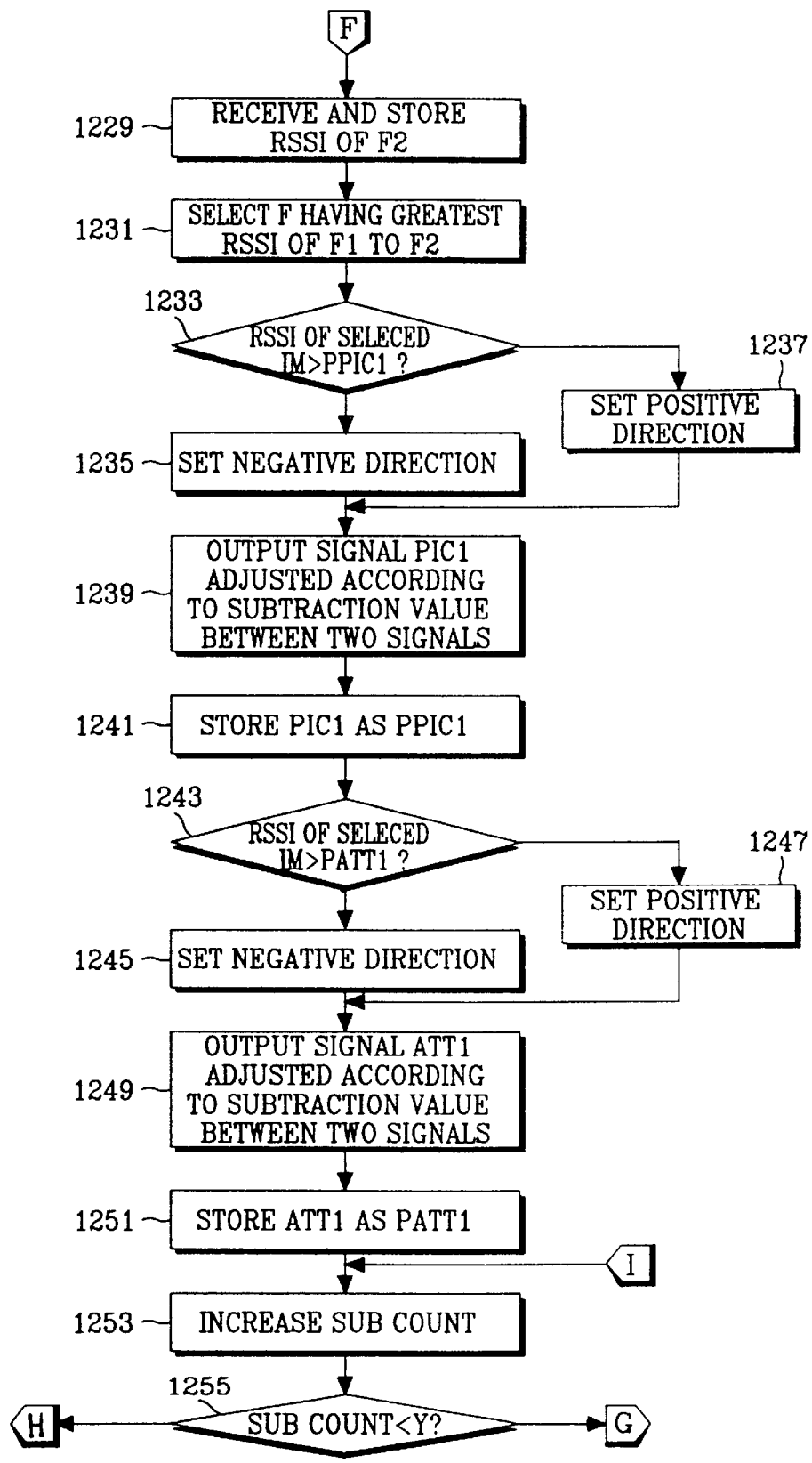
Figure 10F:
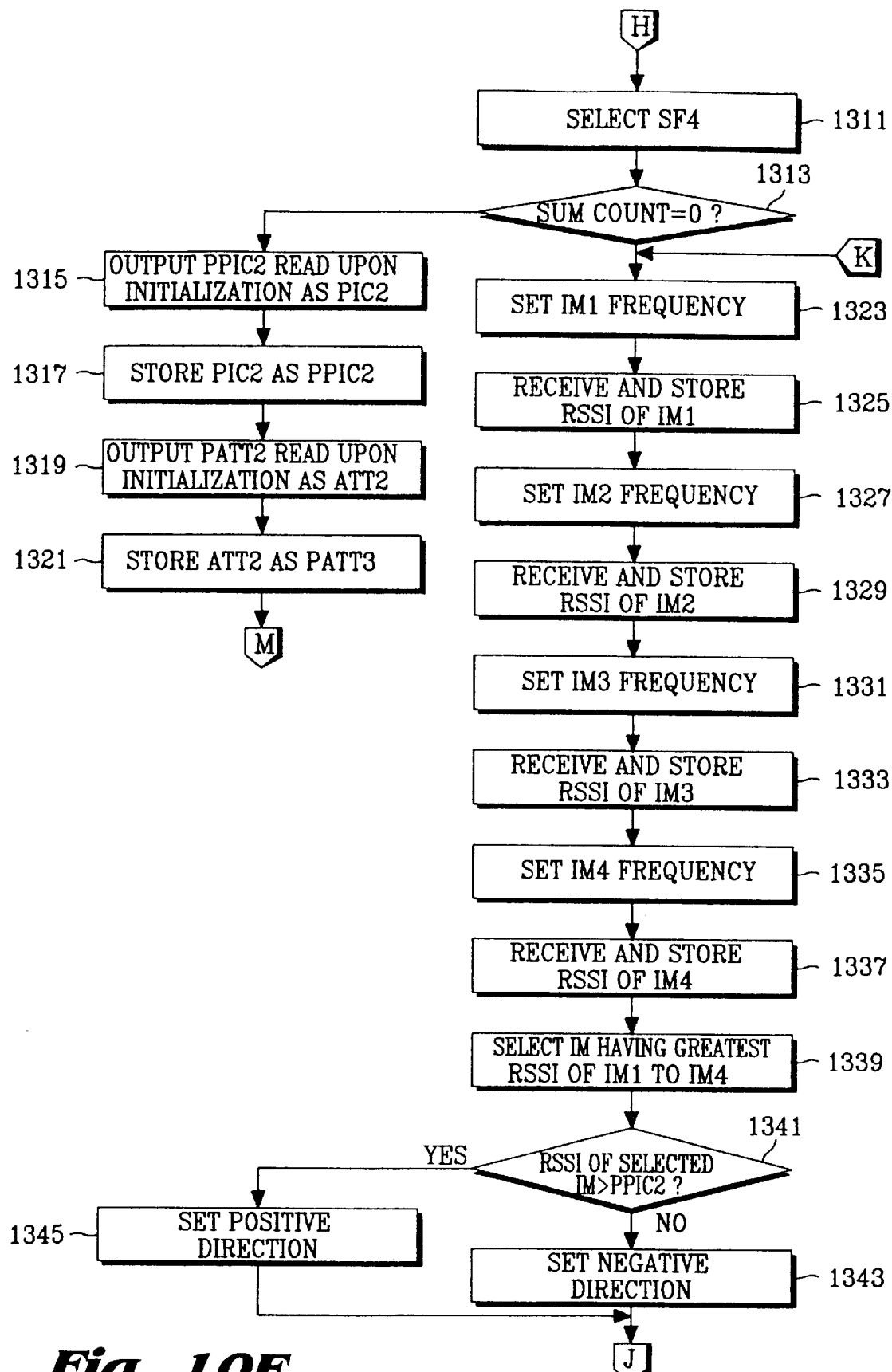
Figure 10G:
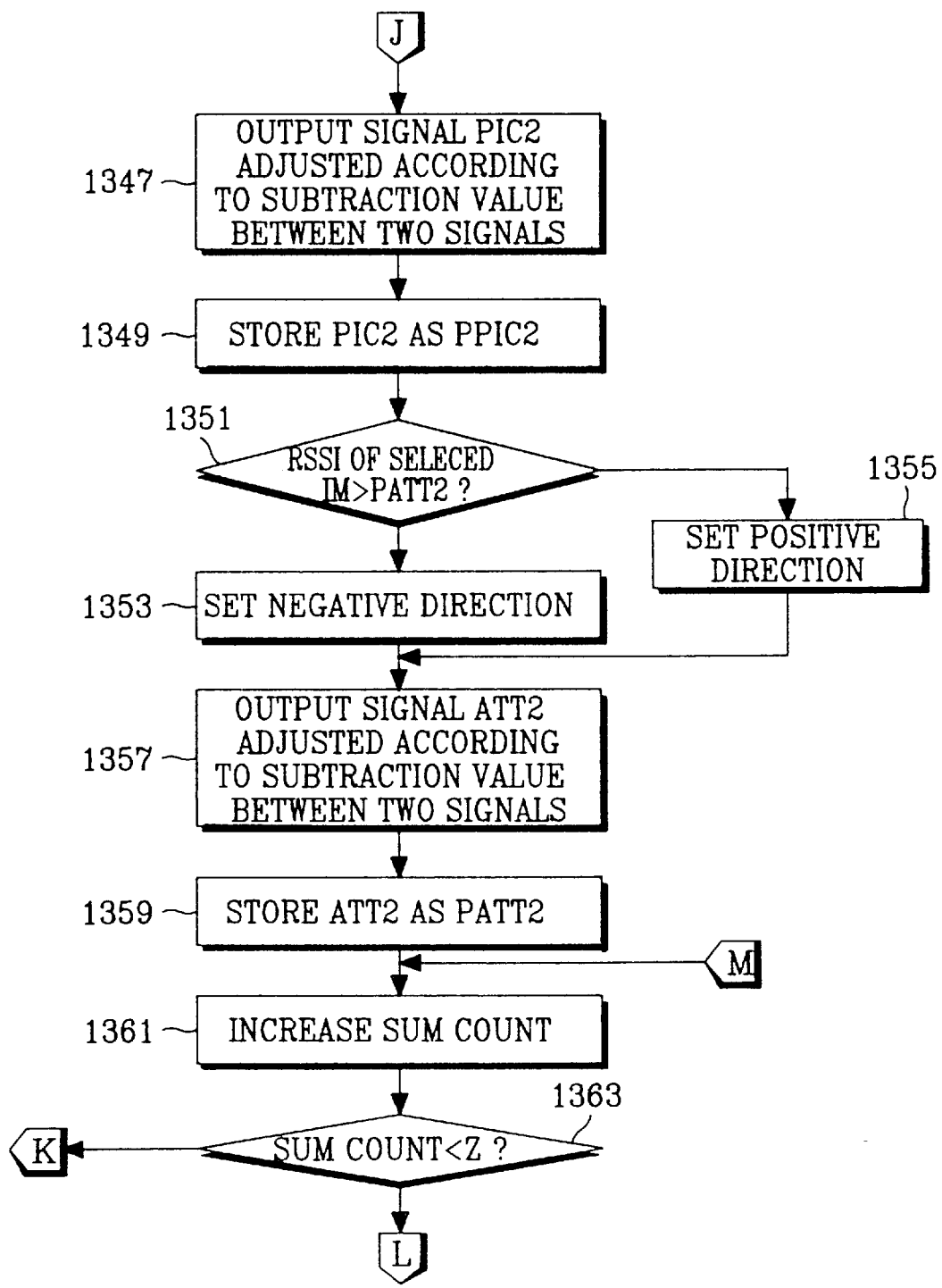
Figure 11A:
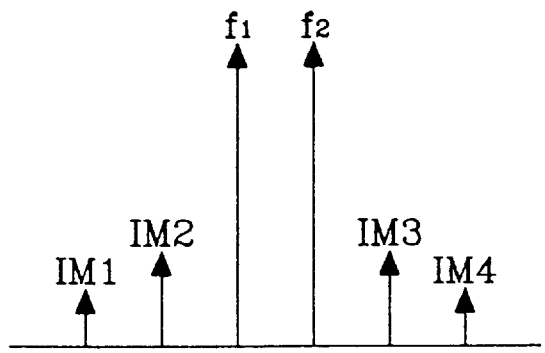
FIGS. 11A through 11C are flow charts illustrating the setting of a frequency to control the attenuation and the phase of an amplified signal in accordance with the techniques shown in FIGS. 10A through 10G.
Figure 11B:
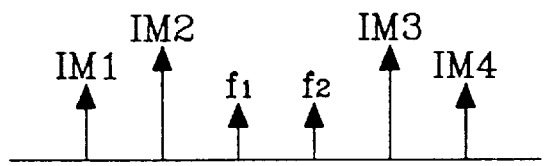
Figure 11C:
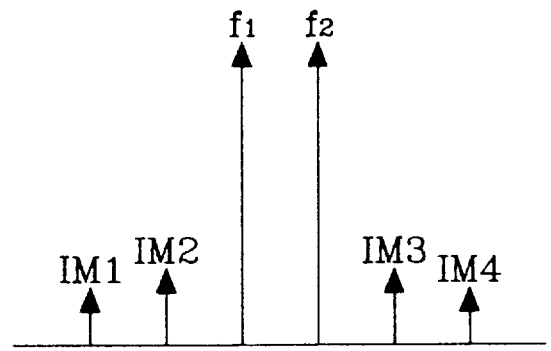

FIGS. 11A to 11C are flow charts illustrating the characteristic of setting a frequency to control the attenuation and the phase of a signal in FIG. 10, wherein FIG. 11A is represented as the second signal SF2 as the output of the main power amplifier 214 routed by the signal coupler 232, FIG. 11B is represented as the third signal SF3 as the output routed by the signal coupler 233, and FIG. 11C is represented as the fourth signal SF4 as the finally output amplified signal routed by the signal coupler 224.

With reference to FIGS. 10A to 10G and FIGS. 11A to 11C, the controller 237 first performs an initialization operation of the linear power amplifier at step 1000. The CPU 811 of the controller 237 as shown in FIG. 8 reads the voltage values of the attenuation control signals ATT1 to ATT3 and the phase control signals PIC1 to PIC3 with the specific power and the specific frequency, stores the read voltage values in the corresponding area of the RAM 813, and initializes the corresponding areas of the RAM 813 for storing the RSSI value corresponding the number of the transmitting channels and the service channel information. The initialization operation is performed only upon the linear power amplifier is firstly operated. Once the linear power amplifier is operated, the initialization operation is no longer necessary.

When the initialization operation is completed, the CPU 811 outputs the switch control signal SWC for selection of the first signal SF1 output from the power divider 231 in order to determine the service channel at step 1011 and outputs the control data PCD for selection of the first channel of the transmission band at step 1013. In this case, the signal selector 235 selectively outputs the first signal SF1 by the switch control signal SWC and the signal detector 236 detects the RSSI for the first channel frequency by the control data PCD. Thereafter, the controller 237 receives and stores the RSSI received in the set channel, in the corresponding channel area of the RAM 813 at step 1015 and increase the channel number in order to detect the RSSI of the next channel at step 1017. The channel scanning operation as described above is performed to the last channel of the transmission band while repeatedly performing steps 1011 to 1019.

Concerning the channel scanning operation performed as above, the controller 237 detects the RSSI detected in each channel and stores the detected RSSI in an interior thereof while sequentially increasing the channel number from the first channel to the final channel with respect to the total channels of the transmission band. In the case that the mobile communication system is a code-division-multiplexing-access system (CDMA), the transmitting band is 869.640 MHz to 893.19 MHz and the channel interval is 1.23 MHz. Thus, in the case of the CDMA system, the band of the first signal SF1 is 869.640 MHZ to 893.19 MHz, the control data PCD is to designate the first signal SF1 from the first channel frequency, 869.640 MHz as a 20nth channel frequency, 893.10 MHz, in an interval of 1.23 MHz, in a sequential manner. In the CDMA system as mentioned previously, the controller 237 detects the RSSI of the designated channel and stores the detected RSSI in the RAM 813 while orderly designating each channel frequency of the transmitting band of 869.640 MHz to 893.19 MHz in the channel scanning operations.

When the channel scanning operation is finalized, the controller 237 summarizes the RSSI of the overall channels which are stored in the RAM 813 at step 1021 and calculates the average value by dividing the summarized value of the RSSI of the overall channels by the number of the channels at step 1023. Following that, while performing steps 1015 to 1035, the controller 237 determines the service channels. At step 1025 for determining the service channel, the controller 237 access the RSSI values of each channel stored in the RAM 823 in an order manner and compares the accessed value with the averaged value. Then, upon determining that the RSSI of the channel is more than the averaged value at step 1027, the controller 237 determines whether the RSSI value of the corresponding channel is more than a reference value $+\alpha$ at step 1029. Herein, it is assumed that $\alpha=3$ dB. Thus, if the RSSI value of the present channel is more than the average value and the reference value at steps 1027 and 1029, the controller 237 checks at step 1029, whether or not the RSSI value of the corresponding channel is more 30 dB than the reference value $+\alpha$. This is to set the channels having the confident signal distortion as the service channel even if the detected RSSI value is more than the average value. When the RSSI value of the present channel is more than the average value and the reference value $+\alpha$, the controller 237 sets the corresponding channel as the service channel at step 1031. While repeatedly performing steps 1025 to 1035, the controller 237 checks the size of the RSSI of the overall channels and sets the service channels.

After selecting the first signal SF1 as described hereinabove, the controller 237 detects and analyzes the RSSI value of the overall channels of the band of the first signal SF1, and sets and stores the channel to be transmitted and serviced. Thereafter, the controller 237 amplifies and outputs the RF signals of the set service channels. However, for convenience of the explanation, two sequent channels are serviced in the embodiment of the present invention. At this time, the frequency of the RF signal of each channel is assumed as f1 and f2, and the intermodulation signal is assumed as IM1 to IM2.

In FIG. 10B, through steps 1111 to 1163, the controller 237 checks the intermodulation signal included in the output of the main power amplifier 214 and controls the variable attenuator 315 and the variable phase shifter 316. The predistortor 213 generates the predistortion signal for suppression of the intermodulation distortion capable of being generated in the main power amplifier 214 upon amplification, and the controller 237 detects the RSSI of the intermodulation signal included in the output of the main power amplifier 214 and variably controls the phase and the level of the predistortion signal, so that the intermodulation signal can be smoothly suppressed in the main power amplifier 214. In the embodiment of the present invention, after detecting the RSSI of the intermodulation signal output from the main power amplifier 214, it is assumed that the controller 237 compares the detected value with the RSSI of the intermodulation signal of the previous state, and performs control operations of three steps according to the compared results. Here, it is assumed that the ADC 814 and the DAC 815 are 16 bit converters, the first step is set as three steps, the second step is set as ten steps, and the third step is set as twenty steps. The step becomes a quantization step upon A/D conversion. And then, in the time when the initial level and phase is controlled, the controller 237 increases the phase and the attenuation control signal by one (1) step and the RSSI of the IM signal is detected from the second control operation to X'nth control operation. The controller 237 controls it as the first step in the case that the comparison difference is below ten steps, controls it as the second step in the case that the comparison difference is below 20 steps, controls it as the third step in the case that the comparison difference is above twenty (20) steps. As mentioned above, the operation of controlling the level and the phase of the predistortion signal is consecutively performed in X times.

In FIG. 10B, the controller 237 outputs the switch control signal SWC for selection of the second signal SF2 at step 1111. Thus, the signal selector 235 selects the signal as shown in FIG. 11A which is output from the main power amplifier 214 so as to produce the selected signal to the signal detector 236. The controller 237 determines whether the value of the HG count us set as zero "0" at step 1113. At this time, the HG count counts the suppressed number of the intermodulation signal contained in the main power amplifier 214. Here, when the value of the HG count is set as zero "0", the controller 237 outputs the phase control signal PIC3 as the phase control signal PPPIC3+1 step value of the previous state (initial state) at step 1115, and converts the phase control signal PIC3 into the analog signal by the DAC6 of the DAC 815, then to be applied to the variable attenuator 316. Thus, the variable attenuator 316 of the predistortor 213 adjusts the phase of the predistortion signal output from the harmonics generator 314 by the phase control signal PIC3 and couples the adjusted level to the input terminal of the main power amplifier 214. And then, in step 1117, the controller 237 stores the phase control signal PIC3 as the previous phase control signal PPIC3 for the next state. Also, the controller 237, in step 1119, outputs the attenuation control signal ATT3 as the attenuation control signal PATT3+1 of the previous state and converts the attenuation control signal ATT3 into the analog signal by the DAC5 to be applied to the variable attenuator 315. At this point, the variable attenuator 315 of the predistortor 213 adjusts the level of the predistortion signal output from the harmonics generator 314 by the attenuation control signal ATT3 and couples the adjusted level to the input terminal of the main power amplifier 214. Following that, the controller 237 stores the attenuation control signal ATT3 as the previous attenuation control signal PATT3 at step 1121.

It can be seen from that the first phase and level controlling of the predistortion signal as stated above is performed by adding one step to the control signal of the previous state. However, the corresponding control signal can occur with comparing the difference between the present detected control signal and the control signal of the previous state. After controlling the phase and the level of the predistortion signal as described above, the controller 237 increases the HG count at step 1161.

After controlling the phase and the level of the predistortion signal as described hereinbefore, the controller 237 again performs steps 1123 to 1135, detects the RSSIs of the intermodulation signals IM1 to IM4 included in the output of the main power amplifier 214 and selects the intermodulation IM having the greatest RSSI value at step 1139. The controller 237 then sequentially outputs the control data PCD for designating the signals IM1 to IM4 as the intermodulation signals in the output of the main power amplifier 214 output from the signal detector 236 as shown in FIG. 11A, and receives and stores the RSSI value of the corresponding IM1 to IM4 intermodulation signal.

Following that, in step 1141, the controller 237 compares the RSSI of the IM signal selected with the phase control signal PPIC3 of the previous state. At this moment, if the IM signal is more than the phase control signal PPIC3, the controller 237 sets the phase control value to be decreased at step 1143 and, if the IM signal is less than the phase control signal PPIC3, the controller 237 sets the phase control value to be increased at step 1145. After setting the increase/decrease of the phase control, the controller 237 obtains the subtraction between the value of the IM signal and the phase control signal PPIC3 of the previous state at step 1147 as shown in FIG. 10C so as to generate the phase control signal PIC3 depending on the above subtraction. The phase control signal PIC3 is applied to the variable phase shifter 316 through the DAC 815. Thereafter, the controller 237 stores the phase control signal PIC3 as the previous phase control signal PPIC3 to be used in the next state.

In addition, after generating the phase control signal PIC3 as explained above, the controller 237 compares the RSSI of the IM signal selected with the attenuation control signal PATT3 of the previous state at step 1151. In this case, if the IM signal is more than the attenuation control signal PATT3, the controller 237 sets the attenuation control value to be decreased at step 1153. To the contrary, if the IM signal is less than the attenuation control signal PATT3, the controller 237 sets the attenuation control value to be increased at step 1155. After setting the increase/decrease of the attenuation control as described above, the controller 237 obtains the subtraction between the value of the IM signal and the attenuation control signal PATT3 of the previous state at step 1157, thereby generating the attenuation control signal ATT3 according to the above subtraction. The attenuation control signal ATT3 is applied to the variable attenuator 315 through the DAC 815. Thereafter, the controller 237 stores the attenuation control signal ATT3 as the previous attenuation control signal PATT3 at step 1159.

Hereafter, in step 1161, the controller 237 increases the HG count by one and thus, checks whether or not the HG count becomes X value. Then, when the HG count does not become the X value, the controller 237 returns to the aforesaid step 1071, thereby repeatedly performing the above steps. While repeating the above steps, the controller 237 detects the RSSI of the intermodulation signal contained in the output of the main power amplifier 214 and thus, adjusts the phase and the level of the predistortion signal by being compared with the phase and attenuation control signals PIC and ATT and determining the control direction and the control size. Here, the predistortion signal is applied as the back phase of the intermodulation signal to be generated to the main power amplifier 214. At the same of adjusting the phase and the level of the predistortion signal, the controller 237 prevents the generation of the intermodulation signal and, if the HG count becomes X, completes the operation of adjusting the predistortion signal.

After adjusting the phase and the level of the predistortion signal, the controller 237 performs the operation to suppress the RF signal distortion included in the output of the signal canceler 219.

In FIG. 10D, the controller 237 detects, in steps 1211 to 1255, the RF signal distortion pertaining to the output of the signal canceler 219 and controls the first variable attenuator 211 and the first variable phase shifter 212. The signal canceler 219 cancels the output of the main power amplifier 214 as shown in FIG. 11A and the RF signal to be input, and detects only the intermodulation signal generated upon amplification. At this point, the controller 237 detects the RSSI of the RF signal included in the output of the signal canceler 219 as shown in FIG. 11B and variably controls the level and the phase of the RF signal so as smoothly to suppress the RF signal in the signal canceler 219. In the embodiment of the present invention, after detecting the RSSI of the RF signal output from the signal canceler 219, the controller 237 compares the detected value with the RSSI of the RF signal of the previous state and performs the control operation including three steps depending on the comparison difference. Herein, when it is assumed that the ADC 814 is the 16 bit converter, the first step is set as three steps, the second step is set as ten steps, and the third step is set as 20 steps. The step becomes the quantization step upon A/D conversion. And then, at the point when the phase and the level are initially controlled, the controller 237 controls the phase and the level as the first step regardless of the detected RSSI, controls it as the first step in the case that the comparison difference is below ten steps, controls it as the second step in the case that the comparison difference is below 20 steps, controls it as the third step in the case that the comparison difference is above 20 steps. As mentioned above, the operations of controlling the level and the phase of the predistortion signal are consecutively performed in X times.

The controller 237 outputs the switch control signal SWC for selection of the third signal SF3 at step 1211. Thus, the signal selector 235 selects the signal as shown in FIG. 11A which is output from the signal canceler 219, thereby outputting the selected signal to the signal detector 236. Hereafter, the controller 237 detects and analyzes the RSSI of the intermodulation signal included in the signal canceler 219, controls the first variable attenuator 211 and the first variable phase shifter 212 and adjusts the level and the phase of the RF signal.

To ensure that the level and the phase of the RF signal are correctly adjusted, the controller 237 checks whether or not the sub count is set as zero "0" at step 1212. Herein, the sub count counts the number of the canceling the RF signal included in the signal canceler 219. Upon the value of the sub count is set as 0, the controller 237 outputs the phase control signal PIC1 as the phase control signal PPIC1+1 step of the previous signal to be stored at step 1215, and converts the phase control signal PIC1 into the analog signal by the DAC2 of the DAC 815 to be applied to the first variable phase shifter 212. Thus, the first variable phase shifter 212 adjusts the phase of the input RF signal by the phase control signal PIC1 and outputs the adjusted phase to the main power amplifier 214. Further, in step 1217, the controller 237 stores the phase control signal PIC1 as the previous phase control signal PPIC1 for the next state. Furthermore, the controller 237 outputs the attenuation control signal ATT1 as the attenuation control signal PATT1+1 step of the previous state at step 1219, and converts the attenuation control signal ATT1 into the analog signal by the DAC1 then to be applied to the variable attenuator 315. Thus, the first variable attenuator 211 adjusts the level of the input RF signal by the attenuation control signal ATT1 and inputs the adjusted level to the main power amplifier 214.

The first phase and level of the RF signal as stated above is controlled by adding one step to the control signal of the previous state. However, the corresponding control signal can occur with comparing the difference between the present detected control signal and the control signal of the previous state. After controlling the phase and the level of the RF signal as described above, the controller 237 increases the SUB count at step 1253.

To the contrary, when the SUB count us set as zero "0" at step 2111, the controller 237 sequentially outputs the control data PCD for designating signals f1 to f2 in the output of the signal canceler 219 as shown in FIG. 1B, and receives and stores the RSSI value of the corresponding signal f1 to f2 at step 1229 as shown in FIG. 10E. The controller 237 selects the f signal having the greatest RSSI value among the f1 to f2 signals at step 1231.

Following that, the controller 237 compares the RSSI of the SF signal selected with the phase control signal PPIC1 of the previous state at step 1233. At this time, if the f signal is more than the phase control signal PPIC1, the controller 237 sets the phase control value to be decreased at step 1235 and, if the f signal is less than the phase control signal PPIC1, the controller 237 sets the phase control value to be increased at step 1237. After setting the increase/decrease of the phase control, the controller 237 obtains the subtraction between the value of the f signal and the phase control signal PPIC3 of the previous state at step 1239, thereby generating the phase control signal PIC1 according to the above subtraction. The phase control signal PIC1 is applied to the first variable phase shifter 212 through the DAC 815. Thereafter, the controller 237 stores the phase control signal PIC1 as the previous phase control signal PPIC1 to be used in the next state.

In addition, after generating the phase control signal PIC1 at step 1243, the controller 237 compares the RSSI of the f signal selected with the value of the attenuation control signal PATT1 of the previous state. In this event, if the f signal is more than the attenuation control signal PATT1, the controller 237 sets the attenuation control value PATT1 to be decreased at step 1245 and, if the f signal is less than the attenuation control signal PATT1, the controller 237 sets the attenuation control value PATT1 to be increased at step 1247. After setting the increase/decrease of the attenuation control, the controller 237 obtains the subtraction between the value of the f signal and it the attenuation control signal PPIC1 of the previous state at step 1249, thereby generating the attenuation control signal ATT1 according to the above subtraction. The attenuation control signal ATT1 is applied to the first variable attenuator 211 through the DAC 815. Thereafter, in step 1251, the controller 237 stores the attenuation control signal ATT1 as the previous attenuation control signal PATT1.

Hereafter, after increasing the SUB count by one at step 1253, the controller 237 determines whether or not the SUB count becomes Y value at step 1253. Then, when the SUB count does not become the Y value, the controller 237 returns to step 1223, thereby repeatedly performing the above steps. While repeating the above steps, the controller 237 detects the RSSI of the RF signal contained in the signal canceler 219 and thus, adjusts the phase and the level of the RF signal by comparing the RSSI of the RF signal outputted from the signal canceler 219 in the previous phase and determining the control direction and the control size. While adjusting the phase and the level of the input RF signal as above, the controller 237 prevents the generation of the RF signal pertaining to the signal and, if the SUB count becomes Y, completes the operation of suppressing the RF signal included in the signal canceler 219.

In FIG. 10F, the controller 237 detects, in steps 1311 to 1363, the intermodulation signal IM included in the RF signal which is finally output from the main power amplifier 214 and controls the second variable attenuator 220 and the second variable phase shifter 221. The RF signal output from the main power amplifier 214 is compensated through the second delay 215 during the intermodulation signal detected in the sub path is processed, and the intermodulation signal distortion included in the RF signal which is finally outputted by being coupled with back phase of the intermodulation distortion processed in the sub path by the signal coupler 223 can be suppressed. In this case, the intermodulation signal distortion can be included in the RF signal which is finally outputted and the included intermodulation distortion can not help being suppressed. At this moment, the controller 237 detects the RSSI of the intermodulation signals IM1 to IM4 included in the output of the main power amplifier 214 as shown in FIG. 11C and variably controls the phase is and the level of the intermodulation signals IM1 to IM4, in order that the intermodulation signal distortion pertaining to the RF signal which is finally outputted by the signal coupler 223, can be smoothly suppressed in the main power amplifier 214.

In the embodiment of the present invention, after detecting the RSSI of the intermodulation signals IM1 to IM4 contained in the RF signal amplified and finally outputted, it is assumed that the controller 237 compares the detected value with the RSSI of the intermodulation signals IM1 to IM4 of the previous state, and performs the control operation of three steps according to the compared results. Herein, it is assumed that the ADC 814 is the 16 bit converter, the first step is set as three steps, the second step is set as ten steps, and the third step is set as 20 steps. The step becomes the quantization step upon A/D conversion. And then, in the time when the initial level and phase is controlled, the controller 237 increases the phase and the attenuation control signal by 1 step and the RSSI of the IM signal is detected from the second control operation to X'nth control operation. The controller 237 controls it as the first step in the case that the comparison difference is below ten steps, controls it as the second step in the case that the comparison difference is below 20 steps, controls it as the third step in the case that the comparison difference is above 20 steps. As mentioned above, the operation of controlling the level and the phase of the predistortion signal is consecutively performed in Z times.

In FIG. 10F, steps 1311 to 1363 are processed with the same order as that of the aforesaid step 1111 to 1163 for adjusting the level and the phase of the predistortion signal. Namely, the controller 237 controls the signal selector 235, selects the fourth signal SF4, controls the signal detector 236, and sequentially selects the intermodulation signals IM1 to IM4. Hereafter, the controller 237 sequentially receives the RSSIs of the intermodulation signals IM1 to IM4 detected in the signal detector 236. After selecting the intermodulation signal IM having the greatest RSSI in the received intermodulation signals IM1 to IM4, the controller 237 compares the RSSI of the present detected intermodulation signal IM with the corresponding intermodulation signal IM of the previous state. The controller 237 controls the second variable phase shifter 221 and the second variable attenuator 220 with obtaining the phase control signal PIC2 and the attenuation control signal ATT2 corresponding to the comparison difference between the above intermodulation signals distortions. At this time, the controller 239 controls the second variable attenuator 220 and the second variable phase shifter 221 by Z times.

As shown in FIGS. 10A to 10G, the linear power amplifier according to the embodiment of the present invention sets the service channels and adjusts the level and the phase of the predistortion signal for suppression of the intermodulation signal included in the main power amplifier 214, in a sequential manner. Also, the above amplifier adjusts the phase and the level of the input RF signal in the main path for suppression of the RF signal contained in the signal canceler 219, and the level 13 and the phase of the intermodulation signal output from the signal canceler 129, so that the intermodulation distortion contained in the finally output amplified RF signal can be suppressed.

As well, an example according to the embodiment of the present invention can be achieved with firstly selecting the service channels, secondly controlling the phase and the level of the predistortion signal, thirdly controlling the phase and the level of the input RF signal, and fourthly controlling the phase and the level of the intermodulation signal distortion output from the signal canceler 219. However, as another embodiment thereto, the operation of selecting the service channels can be performed in an interval of given times by a timer interrupt. In the case of using the above control method, the controller 237 performs the service channel seek operation whenever the timer interrupt is generated, and controls the variable attenuators and the variable phase shifters as noted above in the rest of periods. At this point, upon the timer interrupt is generated in the state where an arbitrary variable attenuator and an arbitrary variable phase shifter are controlled, the controller 237 interrupts the operation and performs the timer interrupt service routine, thereby again returning to the main routine and performing the operation which is under procession.

Further, with respect to FIGS. 10A to 10G, while the number, that is, X, Y, and Z which the variable attenuators and the variable phase shifters are controlled, can be set as the number capable of effectively controlling the level and the phase of the signal input in corresponding variable attenuator and variable phase shifter, the number is set as the same number as each other, more concretely, 5.

Figure 12:
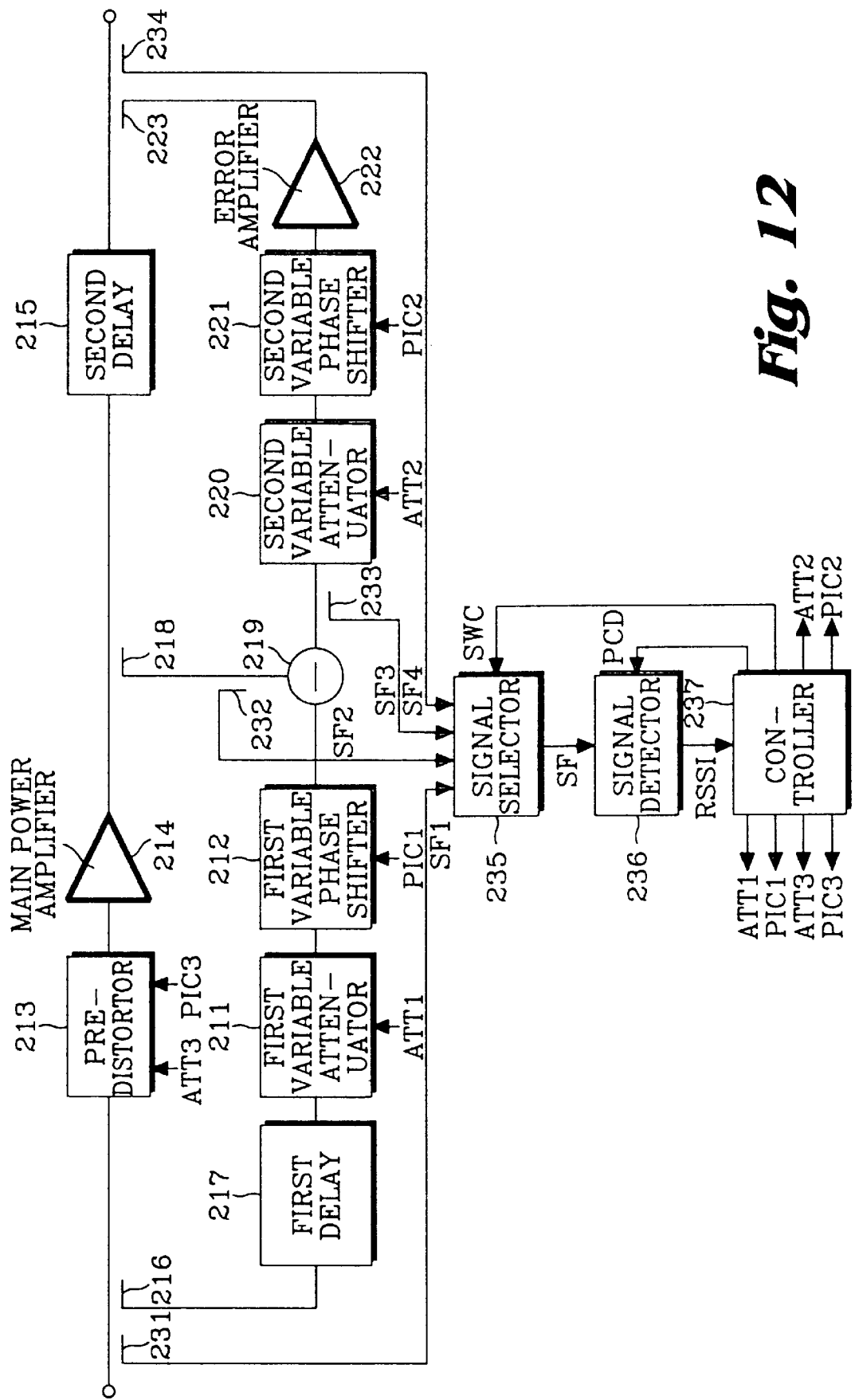
FIG. 12 is a block diagram illustrating a linear power amplifier constructed as a second embodiment of the present invention.

Turn now to FIG. 12 which is a block diagram illustrating a linear power amplifier constructed according to a second embodiment of the present invention. The linear power amplifier according the second embodiment has the same construction as that according the first embodiment as shown in FIG. 2, except that the first variable attenuator 211 and the first variable phase shifter 212 are positioned in the sub signal path.

In connection with FIG. 12, the predistortor 213 on the main signal path has the same construction as that as shown in FIGS. 3 and 5, generates the harmonics corresponding to the input RF signal, controls the level and the phase of the harmonics depending on the attenuation control signal ATT3 and the phase control signal PIC3 of the controller 237, couples the controlled signals to the input RF signal, converts the coupled signals into the predistorted RF signal and outputs the converted signals to the main power amplifier 214. The main power amplifier 214 inputs the output in the predistortor 213, amplifies the predistorted RF signal, and outputs the RF signal where the intermodulation signal distortion is suppressed.

The rest construction of the linear power amplifier is substantially the same as that in the first embodiment of the present invention as shown in FIG. 2. Thus, the numeral references of the second embodiment of the present invention are equal to those of the first embodiment thereof. Furthermore, the controller 237 selectively inputs the first signal SF1 to the fourth signal SF4 in the same manner as that of FIG. 10 and generates the attenuation control signals ATT1 to ATT3 and the phase control signals PIC1 to PIC3 with detection of the RSSI of the RF signal or the intermodulation signal in the selected SF signal. After setting the service channels, the controller 237 orderly adjusts the phase and the level of the predistortion signal for suppression of the intermodulation signal pertaining to the main power amplifier 214, adjusts the level and the phase of the input RF signal in the sub path so as to suppress the RF signal distortion included in the signal canceler 219, and lastly adjusts the level and the phase of the intermodulation signal distortion output from the signal canceler 129 so as to suppress the intermodulation signal distortion contained in the finally output amplified RF signal.

Figure 13:
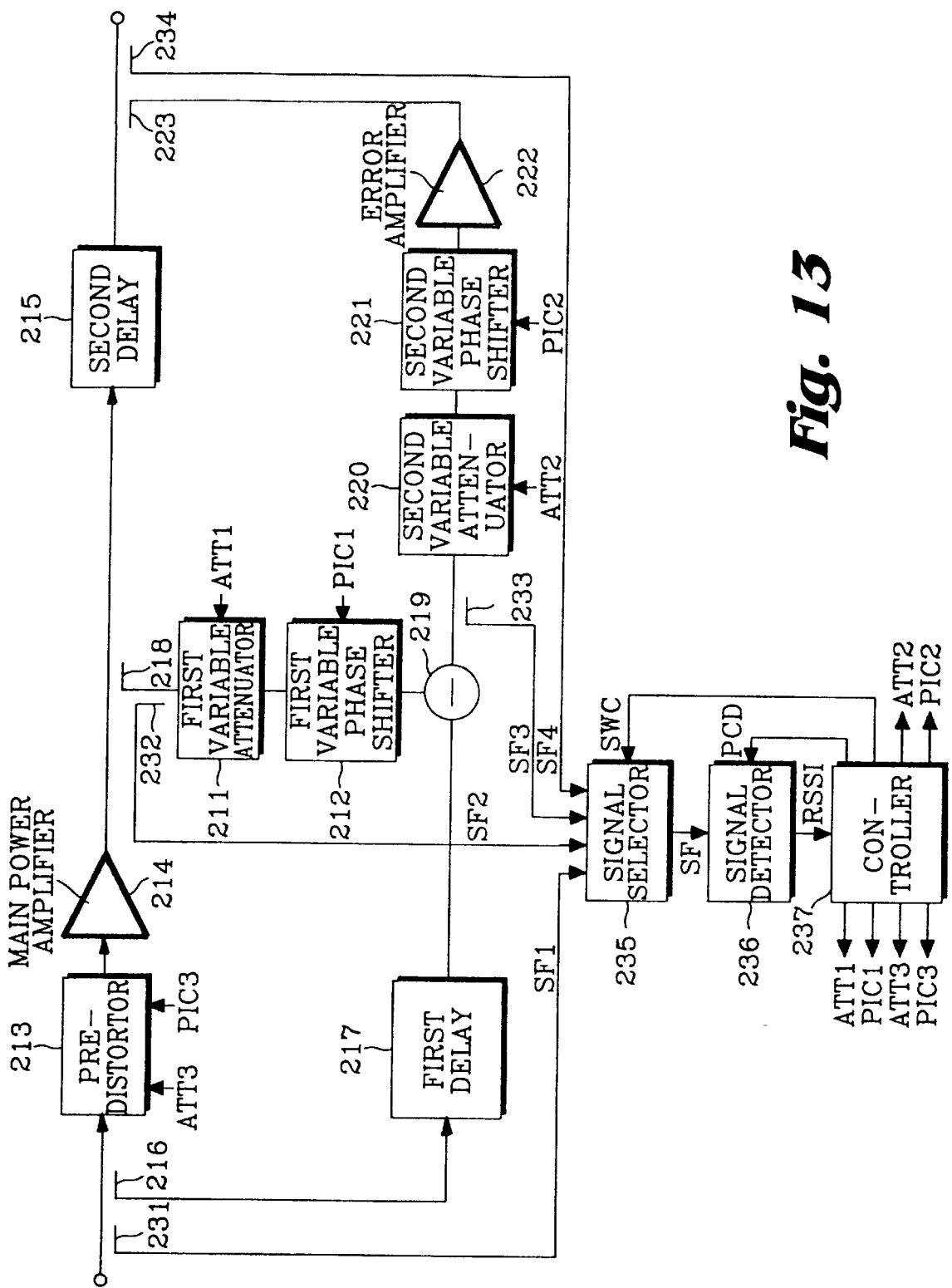
FIG. 13 is a block diagram illustrating a linear power amplifier constructed as a third embodiment of the present invention.

FIG. 13 is a block diagram illustrating a linear power amplifier constructed according to a third embodiment of the present invention. The linear power amplifier according the third embodiment of the present invention has the same construction as that according the second embodiment thereof, as shown in FIG. 13, except that the first variable attenuator 211 and the first variable phase shifter 212 are positioned between the main path and the sub path.

With regard to FIG. 13, the predistortor 213 on the main path has the same construction as that shown in FIGS. 3 and 5, generates the harmonics corresponding to the input RF signal, controls the level and the phase of the harmonics depending on the attenuation control signal ATT3 and the phase control signal PIC3 of the controller 237, couples the controlled signals to the input RF signal, converts the coupled signals into the predistorted signal, and lastly outputs the converted signal to the main power amplifier 214. The main power amplifier 214 inputs the output to the predistortor 213 and outputs the RF signal where the intermodulation signal distortion is suppressed, through amplifying the predistorted RF signal.

The first delay 217 located at the sub path, inputs the RF signal divided in the main path by the power divider 216, delays the RF signal during the RF signal is processed in the predistortor 213 and the main power amplifier 214, and outputs the delayed RF signal to the signal canceler 219.

The first variable attenuator 211 and the first variable phase shifter 212 are connected between the power divider 218 and the signal canceler 219, which respectively control the level and the phase of the input RF signal by the attenuation control signal ATT1 and the phase control signal PIC1 output from the controller 237 and outputs the controlled level and phase to the signal canceler 219. That is, the first variable attenuator 211 and the first variable phase shifter 212 are positioned between the main path and the sub path, and the phase and the level of the RF signal amplified and output from the main power amplifier 214 on the main path are controlled to thereby be outputted to the signal canceler 219.

The rest construction of the linear power amplifier is equal to that in the first embodiment of the present invention as shown in FIG. 2, except for the above construction. Thus, the numeral references of the second embodiment of the present invention are equal to those of the first embodiment thereof.

Furthermore, the controller 237 selectively inputs the first signal SF1 to the fourth signal SF4 in the same manner as that of FIG. 10 and generates the attenuation control signals ATT1 to ATT3 and the phase control signals PIC1 to PIC3 with detection of the RSSI of the RF signal or the intermodulation signal in the selected SF signal. After setting the service channels, the controller 237 orderly adjusts the phase and the level of the predistortion signal for suppression of the intermodulation signal pertaining to the main power amplifier 214, adjusts the level and the phase of the input RF signal in the sub path so as to suppress the RF signal distortion included in the signal canceler 219, and lastly adjusts the level and the phase of the intermodulation signal distortion output from the signal canceler 129 so as to suppress the intermodulation signal distortion contained in the finally output amplified RF signal.

Like the linear power amplifier according to the first embodiment of the present invention, the linear power amplifiers according the second and third embodiments of the present invention, firstly select the service channel, secondly control the phase and the level of the predistortion signal, thirdly control the phase and the level of the input RF signal, and fourthly controls the phase and the level of the intermodulation signal output from the signal canceler 219. On the contrary, as another embodiment thereto, the operation of selecting the service channel can be performed in an interval of given times by the timer interrupt. In the case of using the above control method, the controller 237 performs the service channel seek operation whenever the timer interrupt is generated, and controls the variable attenuators and the variable phase shifters as noted above in the rest of periods. At this point, upon the timer interrupt is generated in the state where an arbitrary variable attenuator and an variable phase shifter are controlled, the controller 237 interrupts the operation and performs the timer interrupt service routine and again returns to the main routine to perform the operation which is under procession.

Moreover, with respect to FIGS. 10A to 10G, while the number, that is, X, Y, and Z which the variable attenuators and the variable phase shifters are controlled, can be set as the number capable of effectively controlling the level and the phase of the signal input in corresponding variable attenuator and variable phase shifter, the number is set as the same number as each other, more concretely, 5.

As may be apparent form the foregoing, the linear power amplifier constructed according to the embodiment of the present invention effectively eliminates the intermodulation signal distortion with a predistortion system and a feed forward system. In other words, the linear power amplifier firstly suppresses the intermodulation signal distortion capable of being generated in the main power amplifier by using the predistortion system and secondly suppresses the intermodulation signal pertaining to the output of the main power amplifier by using the feed forward system. In this manner, it is easy to design and manufacture the main power amplifier 214 or the error amplifier 222. Likewise, since the variable attenuators and the variable phase shifters performing the linearity function, have their wide bandwidth in the frequency characteristics and their relatively good flatness, and their good variable characteristics, the linear power amplifier according to the present invention can be used for other communications applications.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the appended claims. In the claims, means-plus-function clause are intended to cover the structures described herein as performing the recited function and not only is structural equivalents but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A linear power amplifier network having a main power amplifier, comprising:

an input terminal for receiving an input signal;

an output terminal for providing an amplified output signal;

a predistortion system connected to said input terminal in a first signal path, for initially suppressing a distortion produced by said main power amplifier by distorting the input signal to said main power amplifier to generate a predistortion signal having the input signal included therein representing a distortion substantially complementary to the distortion produced by said main power amplifier, said predistortion system comprising a power divider for routing the input signal from said input terminal, an automatic level controller for controlling amplitude of said input signal to generate an amplitude controlled signal, a harmonics generator for generating harmonics corresponding to said amplitude controlled signal, and a signal coupler for coupling said harmonics with said input signal to generate said predistortion signal;

said main power amplifier connected to said predistortion system in said first signal path, for amplifying the predistortion signal to generate a power amplified signal;

a feed forward system connected to said input terminal and said output terminal in a second signal path, for finally suppressing said distortion produced by said main power amplifier by canceling the input signal and the power amplified signal to generate an error signal representing the distortion produced by said main power amplifier, error amplifying the error signal to generate an amplified error signal, and combining said amplified error signal with said power amplified signal to generate said amplified output signal at said output terminal.

2. The linear power amplifier network of claim 1, further comprised of said predistortion system generating said predistortion signal representing the distortion substantially complementary to the distortions, in terms of amplitude and phase, produced by said main power amplifier.

3. The linear power amplifier network of claim 1, further comprised of said automatic level controller comprising:

a variable attenuator disposed said power divider and said harmonics generator, for attenuating the amplitude of said input signal to generate said amplitude controlled signal;

a power detector for converting said amplitude controlled signal into direct current voltage; and a level controller for controlling operation of said variable attenuator in accordance with the direct current voltage from said power detector for enabling generation of said amplitude controlled signal.

4. A linear power amplifier network comprising:

an input terminal for receiving an input signal;

an output terminal for providing an amplified output signal;

a main power amplifier;

a predistortion system disposed between said input terminal and said main power amplifier for suppressing distortion produced by said main power amplifier, said predistortion system comprising a first directional coupler for routing the input signal from said input terminal, an automatic level controller for controlling the amplitude of said input signal to generate an amplitude controlled signal, a harmonics generator, for generating harmonics corresponding to said amplitude controlled signal to generate a harmonic signal, a first variable attenuator for attenuating the harmonic signal to generate an attenuated signal in accordance with a first attenuation control signal, a variable phase shifter for controlling the phase of said attenuated signal to generate a phase shifted signal in accordance with a first phase control signal, and a first signal coupler for coupling said phase shifted signal with said input signal to generate a predistortion signal representing a distortion substantially complementary to the distortion produced by said main power amplifier; and a feedforward system disposed between said input terminal and said output terminal for suppressing said distortion produced by said main power amplifier by canceling the input signal and an output of said main power amplifier to produce an error signal with predetermined amplification representing the distortion produced by said main power amplifier and combing said error signal with the output of said main power amplifier to generate said amplified output signal at said output terminal.

5. The linear power amplifier network of claim 4, further comprised of said automatic level controller comprising:

a variable attenuator disposed said power divider and said harmonics generator, for attenuating the amplitude of said input signal to generate said amplitude controlled signal;

a power detector for converting said amplitude controlled signal into direct current voltage; and a level controller for controlling operation of said variable attenuator in accordance with the direct current voltage from said power detector for enabling generation of said amplitude controlled signal.

6. The linear power amplifier network of claim 4, further comprised of said automatic level controller comprising a power detector coupled to receive said input signal for transforming said input signal into a direct current control voltage for controlling amplitude gain of said input signal to generate said amplitude controlled signal.

7. The linear power amplifier network of claim 6, further comprised of said power detector comprising:

a transformer for transforming said input signal into a first transformed signal and a second transformed signal having a phase difference of 180°;

first and second Schottky diodes disposed to convert the first and second transformed signals into said direct current control voltage; and means for filtering said direct current control voltage.

8. A linear power amplifier network, comprising:

an input terminal for receiving an input signal;

an output terminal for providing an amplified output signal;

a main power amplifier;

a predistortion system disposed in a first path between said input terminal and said main power amplifier, for initially suppressing distortion produced by said main power amplifier to generate a predistortion signal having said input signal included therein representing a distortion substantially complementary to the distortion produced by said main power amplifier;

a feed forward system disposed in a second path between said main power amplifier and said output terminal, for finally suppressing said distortion produced by said main power amplifier by canceling the input signal and an output of said main power amplifier to generate an error signal representing the distortion produced by said main power amplifier, and combining said error signal exhibiting a predetermined amplification level with said output of said main power amplifier to generate said amplified output signal at said output terminal, said feed forward system comprising:

a directional coupler for routing said input signal from said first signal path to said second signal path;

signal canceler means for canceling said input signal of said second signal path and said output of said main power amplifier to generate said error signal representing the distortion produced by said main power amplifier;

an error amplifier for amplifying said error signal with said predetermined amplification level; and a signal coupler for coupling said error signal exhibiting said predetermined amplification level with said output of said main power amplifier in said main signal path so as to generate said amplified output signal at said output terminal free of distortion.

9. The linear power amplifier network of claim 4, further comprised of said feed forward system comprising:

a second directional coupler for routing said input signal from said first signal path to said second signal path;

signal canceler means for canceling said input signal of said second signal path and said power amplified signal generated from said main power amplifier to generate said error signal representing the distortion produced by said main power amplifier;

an error amplifier for amplifying said en-or signal to generate said amplified error signal; and a second signal coupler for coupling said amplified error signal with said power amplified signal generated from said main power amplifier in said main signal path so as to generate said amplified output signal at said output terminal free of distortion.

10. A linear power amplifier network, comprising:

a predistortion system positioned at a main path, for determining harmonics corresponding to an input signal, coupling the harmonics with said input signal to generate a predistortion signal;

a main power amplifier for amplifying said predistortion signal to generate a power amplified signal;

a first variable atttenuator and phase shifter positioned at a sub path, for adjusting the amplitude and phase of said input signal routed from said main path;

a first delay for delaying said input signal having the amplitude and phase adjusted from said first variable attenuator and phase shifter for a first predetermined period to produce a first delayed signal;

a signal canceler positioned at said sub path, for canceling the power amplified signal from said main path and the first delayed signal to extract an error signal representing a distortion contained in said power amplified signal;

a second variable attenuator and phase shifter for adjusting the amplitude and phase of said error signal;

an error amplifier for amplifying said error signal having the amplitude and phase adjusted from said second variable attenuator and phase shifter to produce an amplified error signal;

a second delay for delaying the power amplified signal for a second predetermined period to produce a second delayed signal; and a first signal coupler for coupling said amplified error signal with the second delayed signal to generate a final output signal substantially free from distortion.

11. The linear power amplifier network of claim 10, further comprised of said predistortion system comprising:

a directional coupler for routing the input signal to said main path;

an automatic level controller connected to said power divider, for controlling amplitude of said input signal to generate an amplitude controlled signal;

a harmonics generator for generating harmonics corresponding to said amplitude controlled signal; and a second signal coupler for coupling said harmonics with said input signal to generate said predistortion signal.

12. A linear power amplifier network, comprising:

first means for adjusting amplitude and phase of an input signal in accordance with a first attenuation control signal and a first phase control signal;

a predistortion system positioned at a main path, for suppressing a distortion produced by a main power amplifier by distorting the input signal to said main power amplifier to generate a predistortion signal having the input signal included therein representing a distortion substantially complementary to the distortion produced by said main power amplifier;

said main power amplifier connected to said predistortion system in said main path, for amplifying the predistortion signal to generate a power amplified signal;

a signal canceler positioned at a sub path, for canceling the power amplified signal from said main path with the input signal to extract an error signal representing a distortion contained in said power amplified signal;

second means for adjusting the amplitude and phase of said error signal in accordance with a second attenuation control signal and a second phase control signal;

an error amplifier for amplifying said error signal to generate an amplified error signal;

a first signal coupler for coupling said amplified error signal with the power amplified signal to generate a final output signal substantially free of distortion;

a signal selector for generating a selected signal upon selection between the power amplified signal from said main power amplifier, the error signal from said signal canceler, and said final output signal;

a signal detector for synchronizing frequencies of the input signal and the error signal, and detecting a received signal strength indicator; and a controller for controlling said signal selector, said signal detector, and generating said first and second attenuation control signals and said first and second phase control signals.

13. The linear power amplifier network of claim 12, further comprised of said predistortion system comprising:
a directional coupler for routing the input signal to said main path;
an automatic level controller connected to said power divider, for controlling amplitude of said input signal to generate an amplitude controlled signal;
a harmonics generator for generating harmonics corresponding to said amplitude controlled signal; and
a second signal coupler for coupling said harmonics with said input signal to generate said predistortion signal.

14. The linear power amplifier network of claim 12, further comprised of said signal detector comprising:
a phase lock loop for generating a local frequency corresponding to input control data;
a mixer for mixing a signal output from said signal selector with the output of said phase lock loop;
a filter for performing frequency down conversion of a frequency output from said mixer; and
a log amplifier for converting the output of said filter into a direct voltage and outputting said converted voltage as said received signal strength indicator.

15. A method for eliminating an intermodulation distortion signal of a linear power amplifier which includes a main power amplifier, comprising the steps of:
(a) firstly suppressing said intermodulation distortion signal generated upon amplification of an input signal in said main power amplifier by constantly maintaining said input signal at a predetermined level, generating a harmonics signal corresponding to said input signal, and generating a predistortion signal after coupling said harmonics signal with said input signal; and
(b) secondly suppressing said intermodulation distortion signal by canceling said input signal and an output of said main power amplifier, extracting said intermodulation distortion signal, error-amplifying the extracted intermodulation distortion signal, and coupling the amplified intermodulation distortion signal with the output of said main power amplifier.

16. The method of claim 15, with said second suppression comprised of:
canceling the firstly-suppressed power amplified signal and said input signal and extracting said intermodulation distortion signal;
amplifying said extracted intermodulation distortion signal; and
secondly suppressing said intermodulation distortion signal contained in a final output signal after coupling said amplified intermodulation distortion signal to said firstly-suppressed power amplified signal.

17. The linear power amplifier network of claim 8, further comprised of said predistortion system comprising:
a power divider for routing the input signal from said input terminal;
an automatic level controller connected to said power divider, for controlling amplitude of said input signal to generate an amplitude controlled signal;
a harmonics generator for generating harmonics corresponding to said amplitude controlled signal; and
a signal coupler for coupling said harmonics with said input signal to generate said predistortion signal.

18. The linear power amplifier network of claim 8, further comprised of said predistortion system comprising:
a first directional coupler for routing the input signal from said input terminal;
an automatic level controller connected to said power divider, for controlling the amplitude of said input signal to generate an amplitude controlled signal;
a harmonics generator connected to said automatic level controller, for generating harmonics corresponding to said amplitude controlled signal to generate a harmonic signal;
a first variable attenuator connected to said harmonics generator, for attenuating the harmonic signal to generate an attenuated signal in accordance with a first attenuation control signal;
a variable phase shifter connected to said variable attenuator, for controlling the phase of said attenuated signal to generate a phase shifted signal in accordance with a first phase control signal; and
a first signal coupler for coupling said phase shifted signal with said input signal to generate said predistortion signal.

19. The linear power amplifier network of claim 17, further comprised of said automatic level controller comprising a power detector coupled to receive said input signal for transforming said input signal into a direct current control voltage for controlling amplitude gain of said input signal to generate said amplitude controlled signal.

20. The linear power amplifier network of claim 19, further comprised of said power detector comprising:
a transformer for transforming said input signal into a first transformed signal and a second transformed signal having a phase difference of 180°;
first and second Schottky diodes disposed to convert the first and second transformed signals into said direct current control voltage; and
means for filtering said direct current control voltage.

21. The linear power amplifier network of claim 18, further comprised of said automatic level controller comprising a power detector coupled to receive said input signal for transforming said input signal into a direct current control voltage for controlling amplitude gain of said input signal to generate said amplitude controlled signal.

22. The linear power amplifier network of claim 21, further comprised of said power detector comprising:
a transformer for transforming said input signal into a first transformed signal and a second transformed signal having a phase difference of 180°;
first and second Schottky diodes disposed to convert the first and second transformed signals into said direct current control voltage; and
means for filtering said direct current control voltage.

23. A linear power amplifying device in a mobile communication system, comprising:
an amplifier for providing an amplified signal by amplifying power of an input transmission signal;
a detector for detecting a strength of an intermodulation signal contained in the amplified signal;
a controller for comparing a strength of the detected intermodulation signal with a strength of a previous intermodulation signal to generate an attenuation and phase control signal; and
a predistortor for applying said intermodulation signal to said amplifier, said predistortor comprising an intermodulation signal generator for generating said intermodulation signal according to the level of the input transmission signal and the attenuation and phase control signal, and a variable attenuator and phase shifter for controlling the gain and phase of said intermodulation signal for application to said input transmission signal as an opposite phase.

24. The device as claimed in claim 23, wherein said predistortor comprises:
an automatic level controller for automatically controlling a level in order to apply the input transmission signal having a constant level;
said intermodulation signal generator for generating said intermodulation signal of high harmonics according to the level-controlled transmission signal;
said variable attenuator and phase shifter for controlling gain and phase of said intermodulation signal by the attenuation and phase control signal; and
a signal coupler for converting an output of said variable attenuator and phase shifter as an opposite phase for coupling with said input transmission signal.

25. The device as claimed in claim 24, wherein said automatic level controller comprises a 180° transformer, a first diode connected to said transformer via a first transmission line and a second diode connected said transformer via a second transmission line, wherein a signal output from said transformer is input to said first and second diodes per a half period, to be converted into a direct current.

26. The device as claimed in claim 23, wherein said detector comprises:
an oscillator for generating a frequency for detection of said intermodulation signal;
a mixer for multiplying an output of said oscillator by the amplified signal to detect said intermodulation signal; and
a filter for low-pass filtering said intermodulation signal for conversion into a direct current for application to said controller.

27. A linear power amplifying device in a mobile communication system, comprising:
a first variable attenuator and phase shifter for performing gain attenuation and phase control of said input transmission signal by a first attenuation and phase control signal;
an amplifier for providing an amplified signal by amplifying power of an output of said first variable attenuator and phase shifter;
a signal canceler for canceling the amplified signal to detect an intermodulation signal;
a second variable attenuator and phase shifter for performing gain attenuation and phase control of an output of said signal canceler according to a second attenuation and phase control signal;
an error amplifier for amplifying power of an output of said second variable attenuator and phase shifter;
a signal coupler for coupling an output of said error amplifier with an output terminal of said amplifier as an opposite phase to remove said intermodulation signal of the amplified signal;
a controller for generating a selection signal, wherein in case that output of the signal canceler is selected, a present output of the signal canceler is compared with the previous output of the signal canceler to thereby generate the first attenuation and phase control signal, and in case that output of the signal coupler is selected, a present output of the signal coupler is compared with a previous output of the signal canceler to thereby generate the second attenuation and phase control signal;

a selector for selecting outputs of said signal canceler and said signal coupler according to the selection signal; and
a detector for detecting a strength of an output from the selector for application to the controller.

28. The device as claimed in claim 27, further comprising:
a first delay positioned between the input transmission signal and the signal canceler, for compensating delayed time according to the first variable attenuation and phase control;
a second delay positioned between the amplifier and the coupler, for compensating delayed time according to the second variable attenuation and phase control.

29. The device as claimed in claim 27, wherein said detector comprises:
an oscillator for generating a frequency of said transmission signal contained in an output of the signal canceler and said intermodulation signal contained in the signal coupler selected by the selection signal;
a mixer for multiplying an output of said oscillator by the amplified signal to generate said transmission signal and said intermodulation signal; and
a filter for low-pass filtering an output of said mixer for conversion into direct current for application to said controller.

30. A linear power amplifying device in a mobile communication system, comprising:
an amplifier for providing an amplified signal by amplifying power of an input transmission signal;
a first variable attenuator and phase shifter for performing gain attenuation and phase control for the amplified signal by a first attenuation and a phase control signal;
a signal canceler for canceling an output of a first variable attenuator and phase shifter from the amplified signal to detect an intermodulation signal;
a second variable attenuator and phase shifter for controlling gain attenuation and phase control for an output of said signal canceler according to a second attenuation and phase control signal to generate an error signal;
an error amplifier for amplifying an output of said second variable attenuator and phase shifter;
a signal coupler for coupling an output of said error amplifier with an output terminal of said amplifier as an opposite phase to remove an intermodulation signal of the amplified signal;
a controller for generating a selection signal, wherein in case that output of canceler is selected, the present output of the canceler is compared with the previous output of the canceler to generate the first attenuation and phase control signal, and in case that output of the signal coupler is selected, the present output of the signal coupler is compared with the previous output of the canceler to generate the second attenuation and phase control signal;
a selector for selecting outputs of the signal canceler and the signal coupler according to the selection signal of the controller; and
a detector for detecting strength of an output of said selector for application to said controller.

31. A linear power amplifying device in a mobile communication system, comprising:
an amplifier for providing an amplified signal by amplifying power of an input transmission signal;

a first variable attenuator and phase shifter for performing gain attenuation and phase control for the amplified signal according to a first attenuation and phase control signal;

a signal canceler for canceling an output of said first variable attenuator and phase shifter to detect an intermodulation signal;

a second variable attenuator and phase shifter for performing gain attenuation and phase control for output of said signal canceler according to a second attenuation and phase control signal to generate an error signal;

an error amplifier for amplifying an output of said second variable attenuator and phase shifter;

a signal coupler for coupling an output of said error amplifier with an output terminal of said amplifier as an opposite phase to remove said intermodulation signal of the amplified signal;

a controller for generating a selection signal, wherein in case that output of the signal canceler is selected, the present output of the signal canceler is compared with the previous output of the signal canceler to generate the first attenuation and phase control signal, and in case that output of the signal coupler is selected, the present output of the signal coupler is compared with the previous output of the signal canceler to generate the second attenuation and phase control signal;

a selector for selecting outputs of the signal canceler and the signal coupler according to the selection signal of the controller; and a detector for detecting strength of an output of said selector for application to said controller.

32. A linear power amplifying device in a mobile communication system, comprising:

a first variable attenuator and phase shifter for performing attenuation and phase control for an input transmission signal by a first attenuation and phase control signal;

a predistortor comprising an intermodulation signal generator for generating an intermodulation signal according to the level of the input transmission signal in which a first attenuation and phase control is performed, and a second variable attenuator and phase shifter for controlling gain and phase of said intermodulation signal according to a second attenuation and phase control signal;

an amplifier for providing an amplified signal by amplifying power of the intermodulation signal;

a signal canceler for canceling the amplified signal to detect said intermodulation signal;

a third variable attenuator and phase shifter for performing gain attenuation and phase control for output of said signal canceler according to a third attenuation and phase control signal;

an error amplifier for amplifying an output of said second variable attenuation and phase shifter;

a signal coupler for coupling an output of said error amplifier with an output terminal of said amplifier as an opposite phase to remove said intermodulation signal of the amplified signal;

a controller for generating a selection signal, wherein in case that output of the signal canceler is selected, the present output of the signal canceler is compared with the previous output of the signal canceler to generate said first attenuation and phase control signal, in case that output of the signal coupler is selected, the present output of the signal coupler is compared with the previous output of the signal canceler to generate said third attenuation and phase control signal, and in case that output of the amplifier is selected, the present output of the amplifier is compared with the previous output of the amplifier to generate said second attenuation and phase control signal;

a selector for selecting output of the signal canceler, the signal coupler and the amplifier according to selection signal; and a detector for detecting strength of an output of said selector for application to said controller.

33. The device as claimed in claim 32, wherein said predistortor comprises:

an automatic level controller for automatically controlling a level in order to apply the input transmission signal having a constant level;

an intermodulation signal generator for generating said intermodulation signal of high-harmonics according to a level-controlled transmission signal;

a variable attenuator and phase shifter for controlling gain and phase of said intermodulation signal by attenuation and phase control signal of said controller; and a signal coupler for converting an output of said variable attenuation and phase shifter as an opposite phase for coupling with the input transmission signal.

34. The device as claimed in claim 33, wherein said automatic level controller comprises a 180° transformer, a first diode connected to said transformer via a first transmission line and a second diode connected said transformer via a second transmission line, wherein an output of said transformer is input to said first and second diodes per a half period for conversion into a direct current level.

35. The device as claimed in claim 33, wherein said detector comprises:

an oscillator for generating a frequency for detection of said intermodulation signal;

a mixer for multiplying an output of said oscillator by the amplified signal to detect said intermodulation signal; and a filter for low-pass filtering said intermodulation signal for conversion into direct current and application to said controller.

36. The device as claimed in claim 33, further comprising:

a first delay positioned between the input transmission signal and the signal canceler, for compensating delayed time according to the first variable attenuation and phase control;

a second delay positioned between the amplifier and the signal coupler, for compensating delayed time according to the second variable attenuation and phase control.

37. A linear power amplifying device in a mobile communication system, comprising:

a predistortor having an intermodulation signal generator and a first variable attenuator and phase shifter, wherein said intermodulation signal generator generates a predistorted intermodulation signal according to the level of an input transmission signal, and said third variable attenuator and phase shifter controls gain and phase of said predistorted intermodulation signal according to the first attenuation and phase control signal;

an amplifier for providing an amplified signal by amplifying power of the predistorted intermodulation signal;

a first variable attenuator and phase shifter for performing gain attenuation and phase control of the input transmission signal by a first attenuation and phase control signal;

a signal canceler for canceling the amplified signal to detect an intermodulation signal;

a second variable attenuator and phase shifter for performing gain attenuation and phase control for output of said signal canceler according to a second attenuation and phase control signal;

an error amplifier for amplifying an output of said second variable attenuator and phase shifter;

a signal coupler for coupling an output of said error amplifier with an output terminal of said amplifier as an opposite phase to remove said intermodulation signal of the amplified signal;

a controller for generating a selection signal, wherein in case that output of the signal canceler is selected, the present output of the signal canceler is compared with the previous output to generate the second attenuation and phase control signal, in case that output of the signal coupler is selected, the present output of the signal coupler is compared with the previous output to generate the third attenuation and phase control signal, and in case that output of the amplifier is selected, the present output of the amplifier is compared with the previous output to generate the first attenuation and phase control signal;

a selector for selecting outputs of the signal canceler, the signal coupler and the amplifier according to the selection signal; and a detector for detecting strength of an output from said selector for application to said controller.

* * * * *